(12) United States Patent
Minami

(10) Patent No.: US 8,179,710 B2
(45) Date of Patent: May 15, 2012

(54) SEMICONDUCTOR MEMORY DEVICE

(75) Inventor: Yoshihiro Minami, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/730,089

(22) Filed: Mar. 23, 2010

(65) Prior Publication Data

US 2011/0182102 A1     Jul. 28, 2011

(30) Foreign Application Priority Data

Jan. 26, 2010   (JP) .................................. 2010-14559

(51) Int. Cl.
    *G11C 11/22*     (2006.01)
(52) U.S. Cl. .......................................... 365/145; 365/65
(58) Field of Classification Search ............... 365/49.13, 365/65, 109, 117, 145, 203, 205, 207; 327/50–57; 257/295, E21.208, E21.663, E21.664, E27.104, 257/E29.164; 438/3
    See application file for complete search history.

(56) References Cited

U.S. PATENT DOCUMENTS

| | | | |
|---|---|---|---|
| 6,621,725 B2 | 9/2003 | Ohsawa | |
| 7,378,286 B2* | 5/2008 | Hsu et al. | 438/3 |
| 2005/0269613 A1* | 12/2005 | Li et al. | 257/295 |
| 2006/0038242 A1* | 2/2006 | Hsu et al. | 257/407 |
| 2006/0081941 A1* | 4/2006 | Iwata et al. | 257/379 |
| 2007/0272960 A1* | 11/2007 | Hsu et al. | 257/295 |
| 2008/0111187 A1 | 5/2008 | Minami | |
| 2008/0157128 A1* | 7/2008 | Katz et al. | 257/215 |
| 2009/0057763 A1 | 3/2009 | Minami | |

FOREIGN PATENT DOCUMENTS

JP     2003-068877     3/2003

OTHER PUBLICATIONS

S. Sakai et al., "Metal-Ferroelectric-Insulator-Semiconductor Memory FET With Long Retention and High Endurance," IEEE Electron Device Letters, vol. 25, No. 6, Jun. 2004, pp. 369-371. Background Art Information.

* cited by examiner

*Primary Examiner* — Alexander Sofocleous
*Assistant Examiner* — Harry W Byrne
(74) *Attorney, Agent, or Firm* — Knobbe, Martens, Olson & Bear, LLP

(57) ABSTRACT

A memory includes memory cells on a semiconductor layer, in which each of the memory cells includes a source layer and a drain layer in the semiconductor layer; an electrically floating body region provided in the semiconductor layer between the source layer and the drain layer and configured to accumulate or discharge electric charges in order to store logical data; a gate dielectric film provided on the body region and comprising a ferroelectric film with polarization characteristics; and a gate electrode provided on the gate dielectric film above the body region, wherein each memory cell stores a plurality of logical data depending on an amount of electric charges accumulated in the body region and on a polarization state of the ferroelectric film.

12 Claims, 19 Drawing Sheets

SEMICONDUCTOR MEMORY DEVICE

CROSS-REFERENCE TO RELATED APPLICATION

This application is based upon and claims the benefit of priority from the prior Japanese Patent Applications No. 2010-14559, filed on Jan. 26, 2010, the entire contents of which are incorporated herein by reference.

FIELD

The present invention relates to a semiconductor memory device.

BACKGROUND

FBC memory devices are semiconductor memory devices expected recently as an alternative to 1T (Transistor)-1C (Capacitor) DRAM memories (JP-A2003-68877(KOKAI)). In the FBC (Floating Body Cell) memory device, an FET (Field Effect Transistor) with a floating body (hereinafter, also body) is formed on an SOI (Silicon On Insulator) substrate, and data "1" or data "0" is stored depending on the number of majority carriers accumulated in the body. FBCs are excellent in its compactness as compared to conventional DRAMs. To further increase the memory capacity of the FBC memory, its unit cell size needs to be further reduced. However, because of the limitation of manufacturing processes, further reduction of the cell size is not easy.

Meanwhile, in recent years, ferroelectric memories (Fe-RAMs (ferro-electric random access memories)) with a ferroelectric film are commanding attention as one type of non-volatile semiconductor memories (Non-Patent Document 1). To further increase the memory capacity of the ferroelectric memory, its unit cell size needs to be further reduced. However, also because of the limitation of manufacturing processes, further reduction of the cell size is not easy.

SUMMARY

A semiconductor memory device according to an embodiment of the present invention comprising a plurality of memory cells on a semiconductor layer, each of the memory cells comprises: a source layer and a drain layer in the semiconductor layer; an electrically floating body region provided in the semiconductor layer between the source layer and the drain layer and configured to accumulate or discharge electric charges in order to store logical data; a gate dielectric film provided on the body region and comprising a ferroelectric film with polarization characteristics; and a gate electrode provided on the gate dielectric film above the body region, wherein each memory cell stores a plurality of logical data depending on an amount of electric charges accumulated in the body region and on a polarization state of the ferroelectric film.

DETAILED DESCRIPTION

Embodiments of the present invention will be explained below in detail with reference to the accompanying drawings. Note that the invention is not limited to the embodiments.
(First Embodiment)

Figure 1:
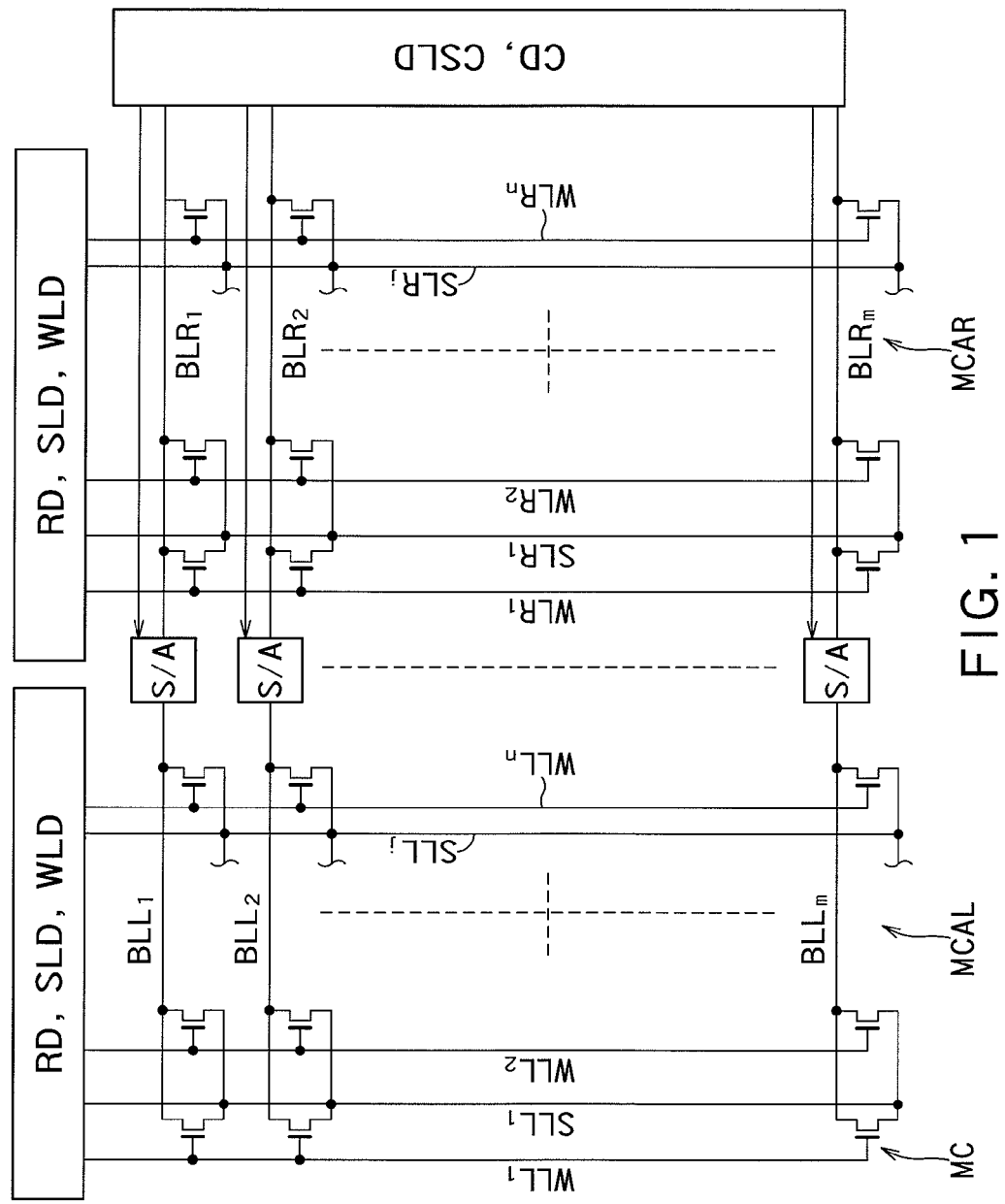
FIG. 1 shows an example of a configuration of a ferroelectric FBC memory device according to a first embodiment of the present invention.

FIG. 1 shows an example of a configuration of a ferroelectric FBC memory device according to a first embodiment of the present invention. The ferroelectric FBC memory device comprises memory cells MC, word lines WLL0 to WLLn and WLR0 to WLRn (hereinafter, also WL), bit lines BLL0 to BLLm and BLR0 to BLRm (hereinafter, also BL), source lines SLLj and SLRj, sense amplifiers S/A, row decoders RD, SL drivers SLD, WL drivers WLD, a column decoder CD, and a CSL driver CSLD.

The memory cells MC are arranged two-dimensionally in a matrix to constitute memory cell arrays MCAL and MCAR (hereinafter, also MCA). The word line WL extends in a row direction and functions as a gate of the memory cell MC. "n" word lines WL are provided on the right and the left sides of the sense amplifier S/A. The "n" is an integer. The bit line BL extends in a column direction and is connected to a source or a drain of the memory cell MC. "m" bit lines BL are provided on the right and the left sides of the sense amplifier S/A. The "m" is also an integer. The word lines WL cross the bit lines BL perpendicularly and the memory cells MC are provided at their intersections. Such cells are called cross point cells. The row direction and the column direction are determined merely for convenience and interchangeable.

The row decoder RD decodes a row address for selecting a specific word line among the word lines WL. The WL driver WLD applies a voltage to a selected word line to activate the selected word line. The SL driver SLD applies a voltage to a selected source line to vary the voltage of the selected source line with respect to voltage of other unselected source lines.

The respective source lines SLLj and SLRj are provided for word line pairs WLLi, WLLi+1 and WLRi, WLRi+1, respectively.

The column decoder CD decodes a column address for selecting a specific column among a plurality of columns. The CSL driver CSLD applies a potential to a selected column line CSL to read data from a sense amplifier S/A to a DQ buffer (not shown). The sense amplifier S/A can read data outside the memory via the DQ buffer. Alternatively, the sense amplifier S/A can write data from the outside of the memory in memory cells via the DQ buffer. Polarity of voltage indicates a voltage in a positive direction or a voltage in a negative direction with respect to a reference potential which is based on a ground potential or a source potential. Polarity of data indicates data "1" or data "0" that are complementary to each other.

Figure 2:
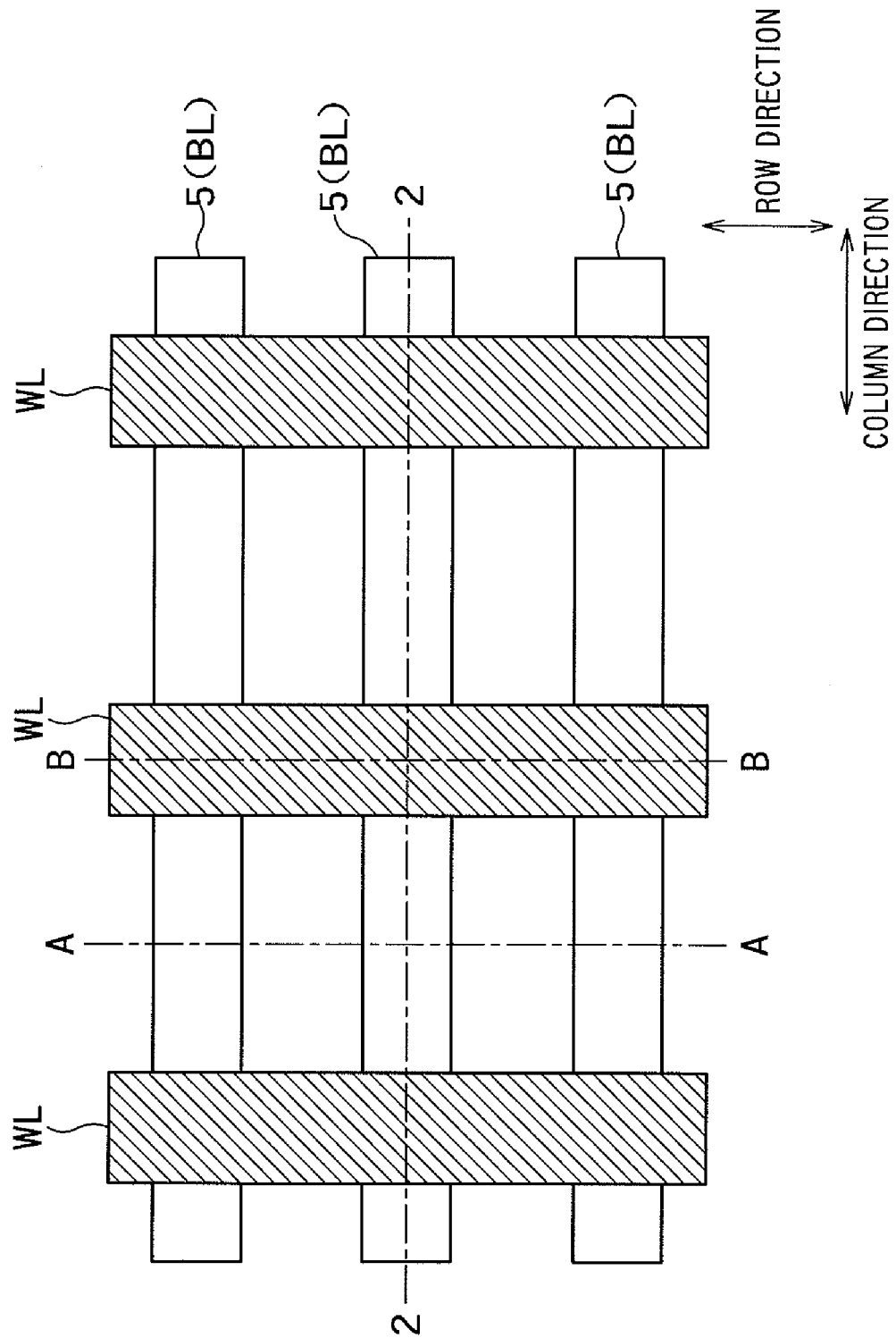
FIG. 2 is a plan view of a cell array area of the ferroelectric FBC memory according to the first embodiment.
Figure 3:
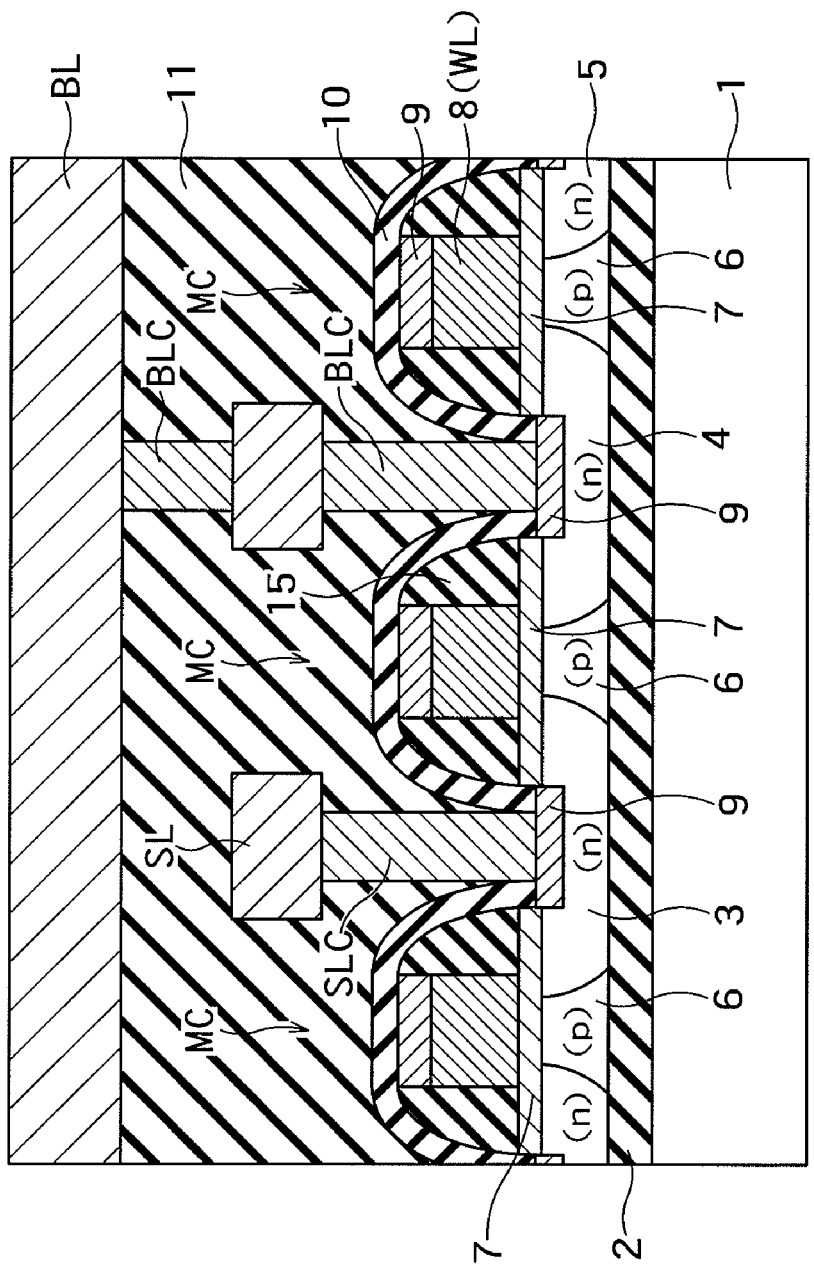
FIG. 3 is a cross-sectional view along a line 2-2 shown in FIG. 2.
Figure 4A:
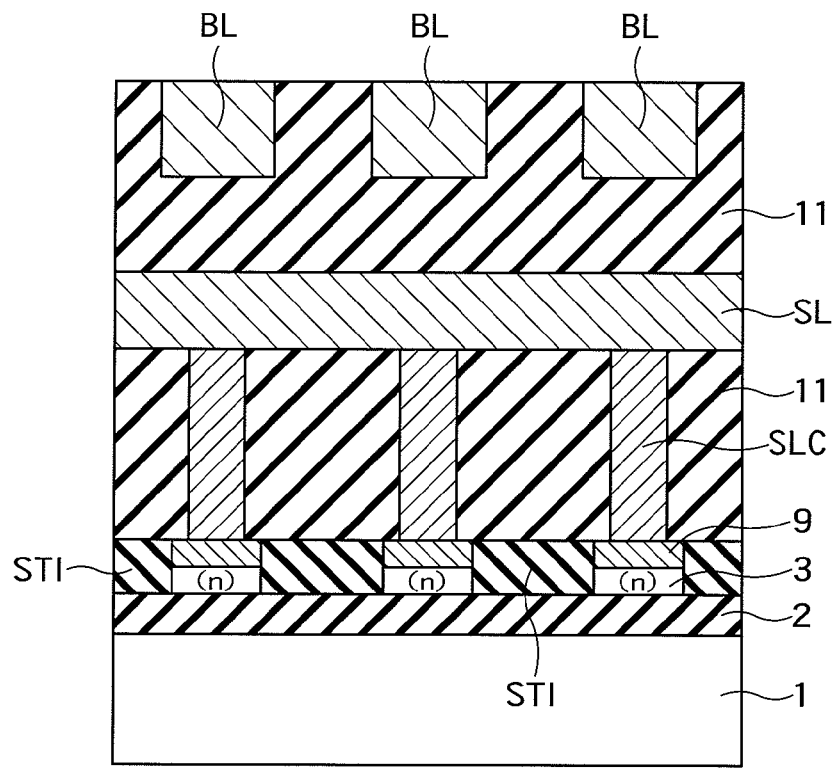
FIG. 4A is a cross-sectional view along a line A-A shown in FIG. 2.
Figure 4B:
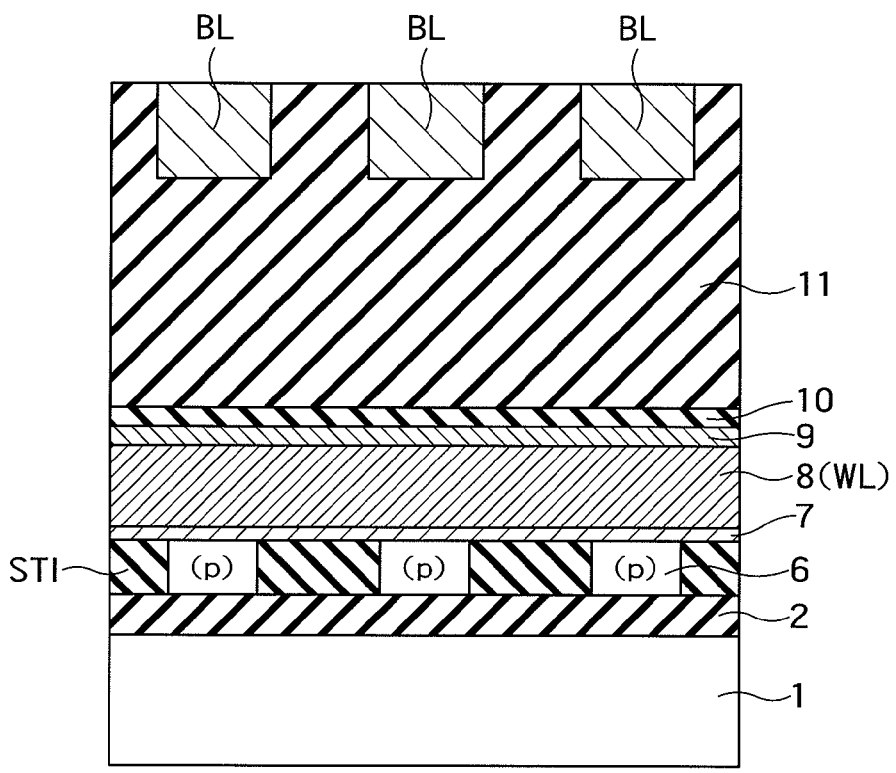
FIG. 4B is a cross-sectional view along a line B-B shown in FIG. 2.
Figure 5:
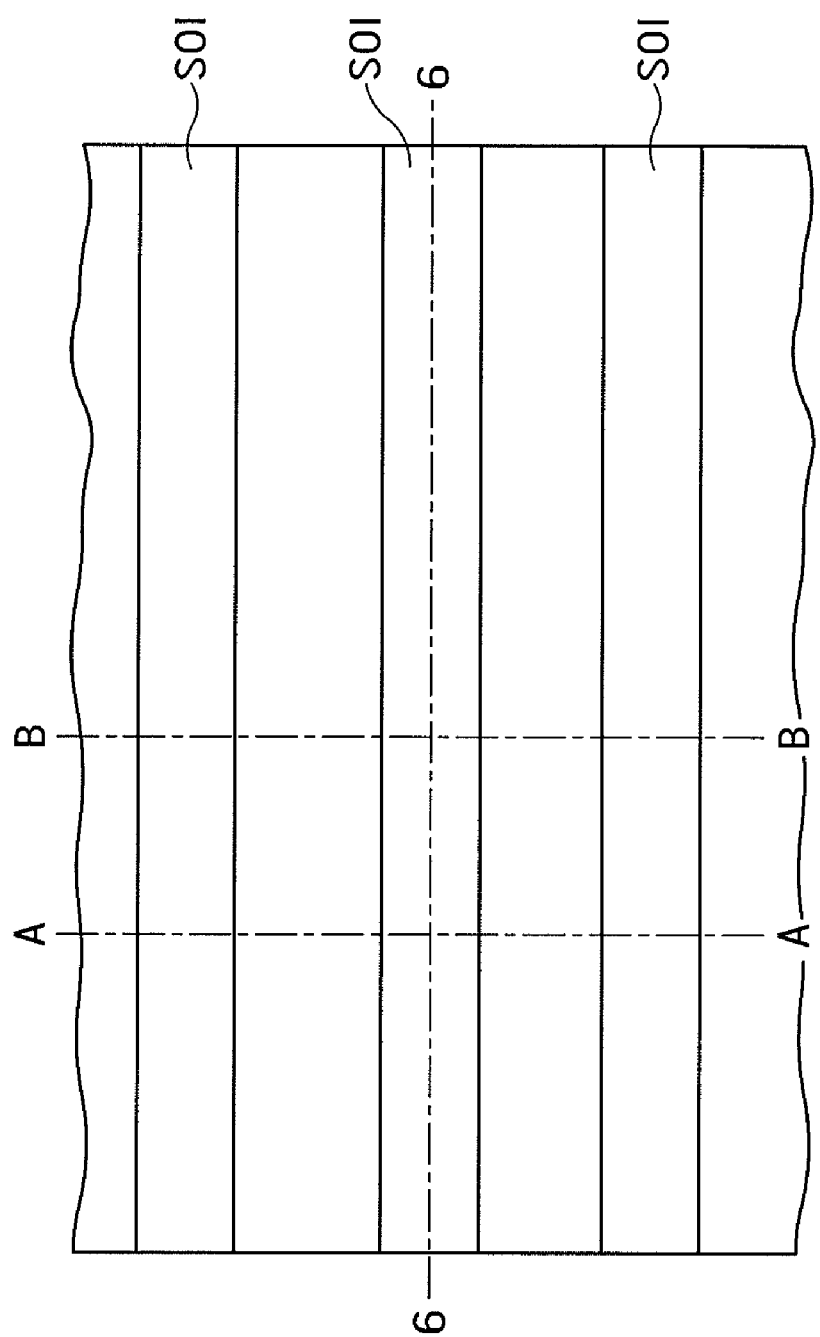
FIGS. 5 to 10B are plan views and cross-sectional views showing a manufacturing method of the ferroelectric FBC memory according to the first embodiment.

FIG. 2 is a plan view of a cell array area of the ferroelectric FBC memory according to the first embodiment. FIG. 3 is a cross-sectional view along a line 2-2 shown in FIG. 2. FIG. 4A is a cross-sectional view along a line A-A shown in FIG. 2. FIG. 4B is a cross-sectional view along a line B-B shown in FIG. 2.

The bit lines BL extend in the column direction and are formed in stripes on a plane. The word lines WL extend in the row direction perpendicular to the column direction and are also formed in stripes on a plane. With reference to FIG. 2, the bit lines BL are omitted and SOI layers 5 are shown instead. The bit line BL is provided above the SOI layer 5 so as to overlap the SOI layer 5.

With reference to FIG. 3, three memory cells adjacent to each other in the column direction are shown. A buried insulating film 2 is provided on a silicon substrate 1 and the SOI layer 5 serving as a semiconductor layer is provided on the buried insulating film 2. An N-type source layer 3 and an N-type drain layer 4 are provided in the SOI layer 5 and a P-type body region 6 is formed in the SOI layer 5 between the source layer 3 and the drain layer 4.

The body region 6 is an electrically floating region accumulating or discharging electric charges for storing logical data. For example, when the memory cell is constituted by an N-FET, the body region 6 accumulates or discharges holes serving as majority carriers to store data. A state that a large number of holes are accumulated in the body region 6 is indicated by data "1" and a state that a small number of holes are accumulated in the body region 6 is indicated by data "0". A memory cell storing the data "0" is called a "0" cell and a memory cell storing the data "1" is called a "1" cell.

A gate dielectric film 7 is provided on the body region 6 and made of a ferroelectric material with polarization characteristics. For example, the gate dielectric film 7 is made of SBT($SrBi_2Ta_2O_9$), PZT($Pb(Zr_xTi_{(1-x)})O_3$), or BLT($(Bi, La)_4Ti_3O_{12}$).

A gate electrode 8 (word line WL) is provided above the body region 6 with the gate dielectric film 7 interposed therebetween. The gate electrode 8 is made of doped polysilicon, for example. To reduce a resistance of the word line WL, a silicide layer 9 is provided on the gate electrode 8. The silicide layer 9 is also provided on the source layer 3 and the drain layer 4 to reduce a contact resistance. Each of the memory cells MC comprises the source layer 3, the drain layer 4, the body region 6, and the gate electrode 8.

A first sidewall film 15 is formed on a side surface of the gate electrode 8. The first sidewall film 15 is provided for forming the source layer 3, the drain layer 4, and the silicide layer 9 in a self-aligned manner. A liner film 10 is provided so as to cover the first sidewall film 15 and the silicide layer 9.

A source line contact SLC is provided between adjacent memory cells MC and electrically connected to the source layer 3. A bit line contact BLC is also provided between adjacent memory cells MC and electrically connected to the drain layer 4.

The source line SL is formed on the source line contact SLC and extends in the row direction like the word line WL. The bit line BL is formed on the bit line contact BLC. The source line SL and the bit line BL are made of metals such as copper. An interlayer dielectric film 11 is provided on the respective memory cells MC.

According to the first embodiment, each of the memory cells MC can store 1-bit data depending on the amount of electric charges accumulated in the body region 6 and 1-bit data depending on a polarization state of the gate dielectric film 7 made of a ferroelectric film. Because the memory cell MC can thus store different data in the body region 6 and in the gate dielectric film 7, it can be used as a multi-bit memory. According to the ferroelectric FBC memory of the first embodiment, because each of the memory cells can store multi-bit data, its memory capacity can be increased without reducing its cell size. As it suffices that a ferroelectric film is used as the gate dielectric film 7 of the first embodiment, the complexity of a manufacturing process of the first embodiment is almost the same as that of a conventional FBC.

Figure 6:
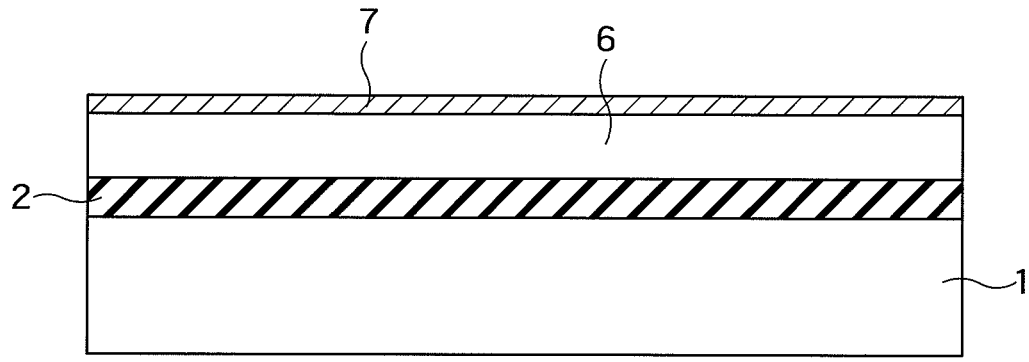
Figure 7A:
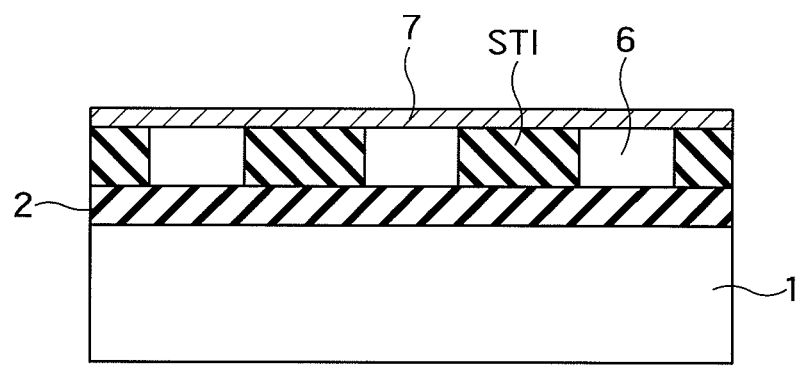
Figure 7B:
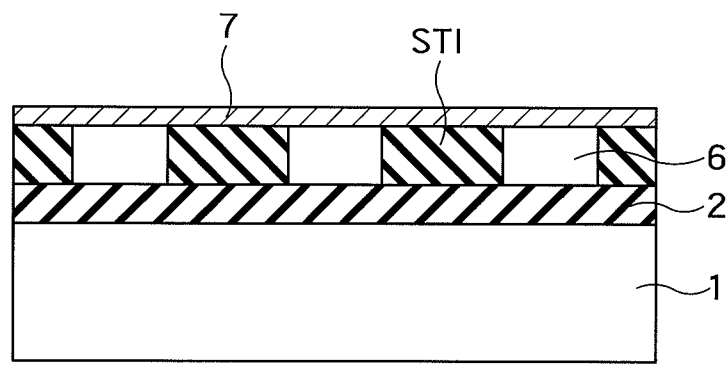

FIGS. 5 to 10B are plan views and cross-sectional views showing a manufacturing method of the ferroelectric FBC memory according to the first embodiment. An SOI substrate is prepared first. The SOI layer 5 is then processed in stripes extending in the column direction. An STI (Shallow Trench Isolation) is formed between adjacent SOI layers 5. A P-type impurity is ion-implanted in the SOI layer 5 to form the P-type body layer 6. The ferroelectric film 7 is deposited on the SOI layer 5 and the STI. A cross-sectional configuration shown in FIGS. 6 to 7B is thus obtained. FIG. 6 is a cross-sectional view along a line 6-6 shown in FIG. 5. FIG. 7A is a cross-sectional view along a line A-A shown in FIG. 5. FIG. 7B is a cross-sectional view along a line B-B shown in FIG. 5.

Figure 8:
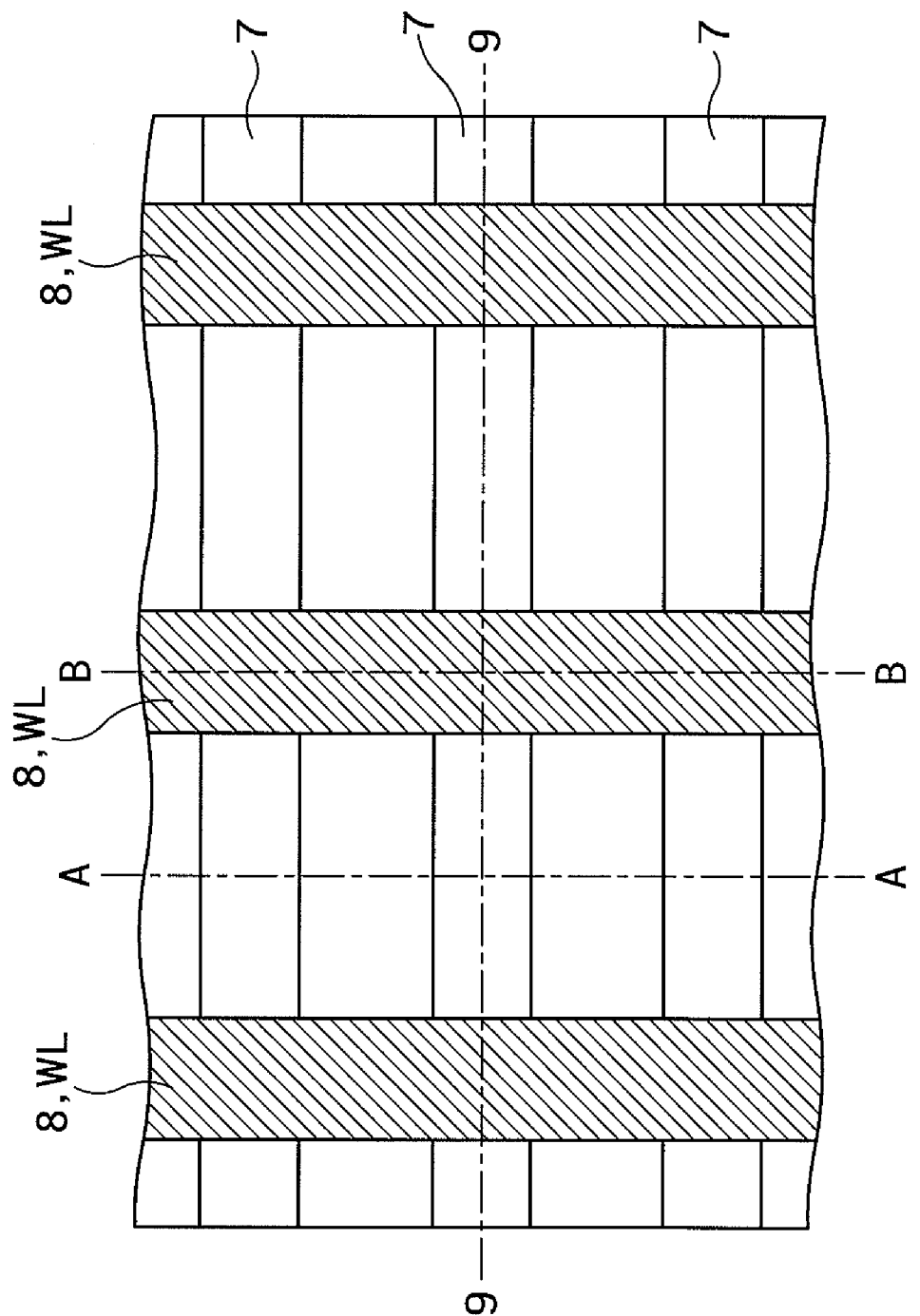
Figure 9:
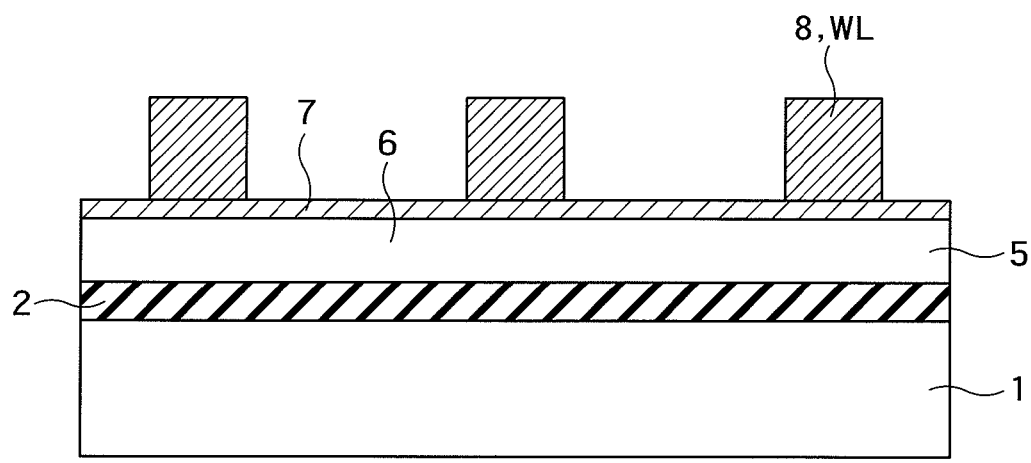
Figure 10A:
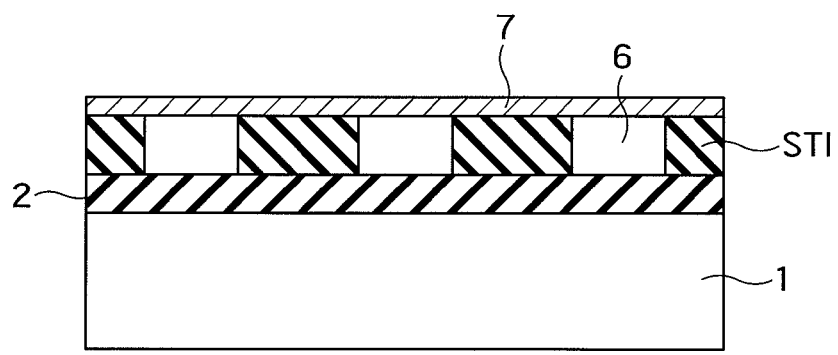
Figure 10B:
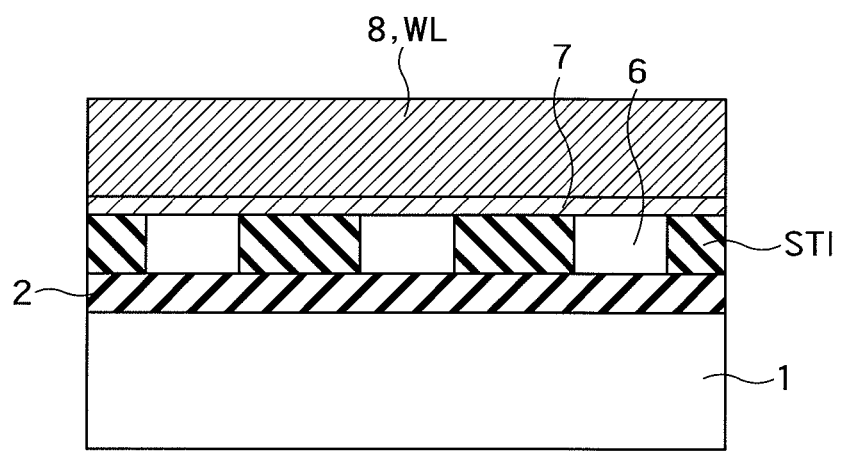

Next, as shown in FIG. 8, a polysilicon film is deposited on the gate dielectric film 7 to form the gate electrode 8 (word line WL) by lithography and RIE (Reactive Ion Etching). A cross-sectional configuration shown in FIGS. 9 to 10B is thus obtained. FIG. 9 is a cross-sectional view along a line 9-9 shown in FIG. 8. FIG. 10A is a cross-sectional view along a line A-A shown in FIG. 8. FIG. 10B is a cross-sectional view along a line B-B shown in FIG. 8.

A material for the first sidewall layer 15 (for example, a silicon oxide film) is then deposited and etched back by RIE. The first sidewall layer 15 is thus formed on the side surface of the gate electrode 8. The gate dielectric film (ferroelectric film) 7 is then etched by using the first sidewall layer 15 and the gate electrode 8 as a mask. The SOI layer 5 is thus exposed between adjacent gate electrodes 7. An N-type impurity is then ion-implanted in the SOI layer 5 by using the first sidewall layer 15 and the gate electrode 8 as a mask. Thermal treatment is further performed, so that the source layer 3 and the drain layer 4 are formed as shown in FIG. 3. Further, a metal (for example, nickel) is deposited on the source layer 3, the drain layer 4, and the gate electrode 8 and the thermal treatment is performed thereon. The silicide layer 9 is thus formed on the top surfaces of the source layer 3, the drain layer 4, and the gate electrode 8.

A material for the liner film 10 (for example, silicon nitride film) is then deposited on the source layer 3, the drain layer 4, and the gate electrode 8. Further, a material for the interlayer dielectric film 11 (for example, a silicon oxide film) is deposited on the liner film 10. The interlayer dielectric film 11 and the liner film 10 on the source layer 3 and the drain layer 4 are etched by lithography and RIE. A contact hole reaching the silicide layer 9 on the source layer 3 and the drain layer 4 is thus formed. A metal (for example, copper) is buried in this contact hole, so that the source line contact SLC and the bit line contact BLC are formed. The source line SL, the interlayer dielectric film, and the bit line BL are then formed. In this way, the ferroelectric FBC memory shown in FIG. 3 is completed.

FIGS. 11 to 14 are equivalent circuit diagrams showing a write operation of the ferroelectric FBC memory according to the first embodiment. Each of source lines SL1 to SL3 is provided so as to be common to two memory cells MC adjacent to each other in the column direction in the first embodiment. Two word lines WLi and WLi+1 are thus provided for one source line SLj. i and j are integers. The word line WLi can be either the word line WLLi or WLRi in FIG. 1. The source line SLj can be either the source line SLLj or SLRj in FIG. 1.

(First Write Step)

Figure 11:
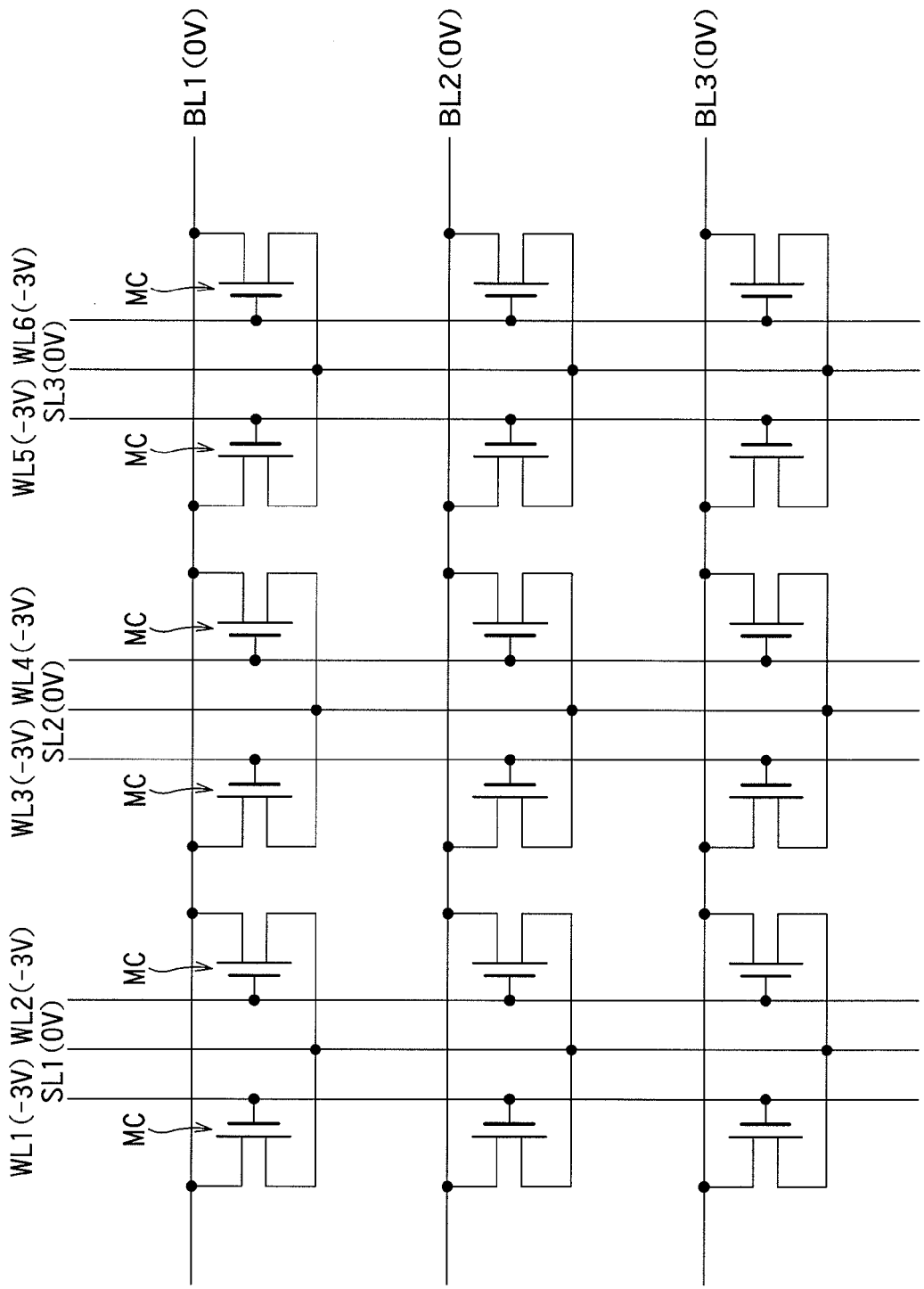
FIG. 11 is a circuit diagram showing a first write step.

First, as shown in FIG. 11, the WL driver WLD applies a negative voltage (for example, −3 V) to all word lines WL1 to WL6 while setting all the source lines SL1 to SL3 and all bit lines BL1 to BL3 to a reference voltage (for example, 0 V). At this time, the negative voltage applied to the word lines WL1 to WL6 is sufficient to polarize a ferroelectric film serving as the gate dielectric film 7. The voltage of the word lines WL1 to WL6 is lower than the potential of the bit lines BL1 to BL3 and the source lines SL1 to SL3 by 3 V. The voltage of the word lines WL1 to WL6 is thus lower than the potential of the body region 6 and the gate dielectric films 7 of all the memory cells MC are polarized in the same direction. Polarizing the gate dielectric film 7 by applying a negative voltage to the word line is called negative polarization for convenience. That is, in an initial step of write, the gate dielectric films 7 of all the memory cells MC are negatively polarized.

(Second Write Step)

Figure 12:
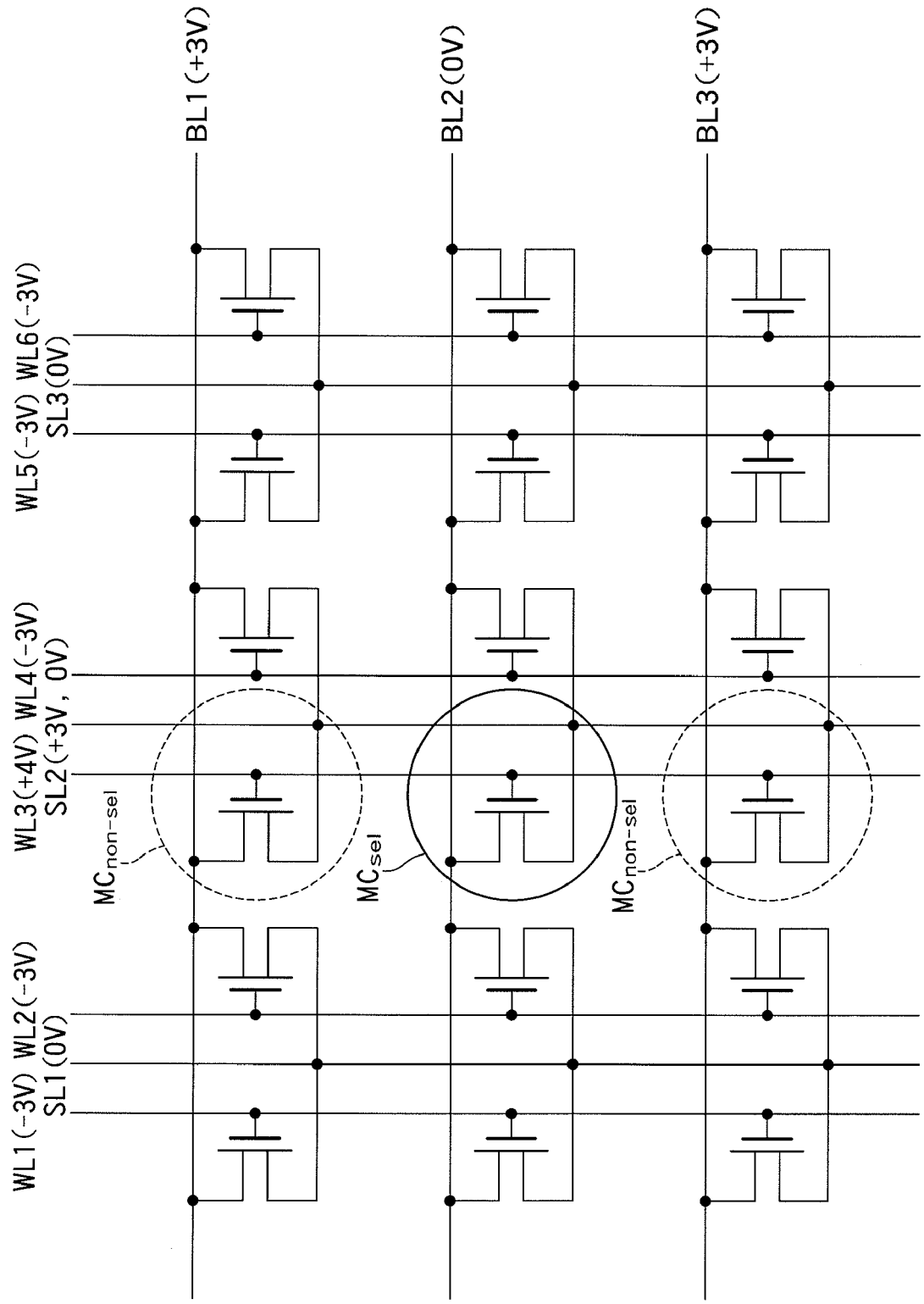
FIG. 12 is a circuit diagram showing a second write step.

Next, as shown in FIG. 12, the polarization state of gate dielectric film 7 of the memory cell MC is selectively inverted. That is, the polarization state of gate dielectric film 7 of a selected memory cell MC is inverted from negative polarization to positive polarization. For example, the WL driver WLD applies a positive voltage (for example, +4 V) to a selected word line WL3 while maintaining unselected word lines WL1, WL2, and WL4 to WL6 at a negative voltage (for example, −3 V) which is opposite to the voltage of the selected word line WL3. The SL driver SLD sets the voltage of a selected source line SL2 corresponding to the selected word line WL3 to a positive voltage (for example, +3 V) while maintaining the voltage of unselected source lines SL1 and SL3 at the reference voltage. Further, the CSL driver CSLD maintains the voltage of a selected bit line BL2 at the reference voltage and sets the voltage of unselected bit lines BL1 and BL3 to a positive potential (for example, +3 V) in a direction which is the same as that of the selected word line WL3.

Gate voltages of a selected memory cell MCsel indicated by a solid line circle in FIG. 12 and an unselected memory cell MCnon-sel shown by a broken line circle in FIG. 12 are increased depending on the positive voltage of the selected word line WL3. Meanwhile, because the selected bit line BL2 to which the selected memory cell MCsel is connected has the reference voltage (for example, 0 V), the potential of the body region 6 of the selected memory cell MCsel is lower than the gate voltage of the selected memory cell MCsel. Accordingly, an electric field in a direction opposite to that of the electric field applied to the gate dielectric film 7 in the first write step is applied to the gate dielectric film 7 of the selected memory cell MCsel. As a result, the gate dielectric film 7 of the selected memory cell MCsel is polarized in the positive direction which is opposite to that of the negative polarization. Applying a positive voltage to the word line WL to polarize the gate dielectric film 7 in this manner is called positive polarization.

Meanwhile, a positive voltage (for example, +3 V) which is the same as the potential of the selected word line WL3 is applied to the bit lines BL1 and BL3 corresponding to the unselected memory cells MCnon-sel connected to the selected word line WL3. The potential of the body region 6 of the unselected memory cell MCnon-sel thus shifts in a direction of potential of the selected word line WL3. Accordingly, an electric field inverting polarization is not applied to the gate dielectric film 7 of the unselected memory cell MCnon-sel. As a result, the gate dielectric film 7 of the unselected memory cell MCnon-sel connected to the selected word line WL3 thus maintains the negative polarization.

A negative voltage (for example, −3 V) is applied to the unselected word lines WL1, WL2, and WL4 to WL6. The bit lines BL1 to BL3 and the source lines SL1 to SL3 have the reference potential or a positive potential which is opposite to that of the unselected word lines WL1, WL2, and WL4 to WL6. Therefore, an electric field in a direction which is the same as that of the electric field applied to the gate dielectric film 7 in the first write step is thus applied to gate dielectric films 7 of unselected memory cells connected to the unselected word lines WL1, WL2, and WL4 to WL6. As a result, the gate dielectric films 7 of the unselected memory cells connected to the unselected word lines WL1, WL2, and WL4 to WL6 maintain the negative polarization.

A positive voltage (for example, +3 V) which is the same as that of the unselected bit lines BL1 and BL3 is applied to the selected source line SL2 in the second write step. However, the voltage of the selected source line SL2 can be maintained at the reference voltage, which is the same as that of the unselected source lines SL1 and SL3. Even in this case, only the gate dielectric film 7 of the selected memory cell MCsel can be selectively inverted.

(Third Write Step)

Figure 13:
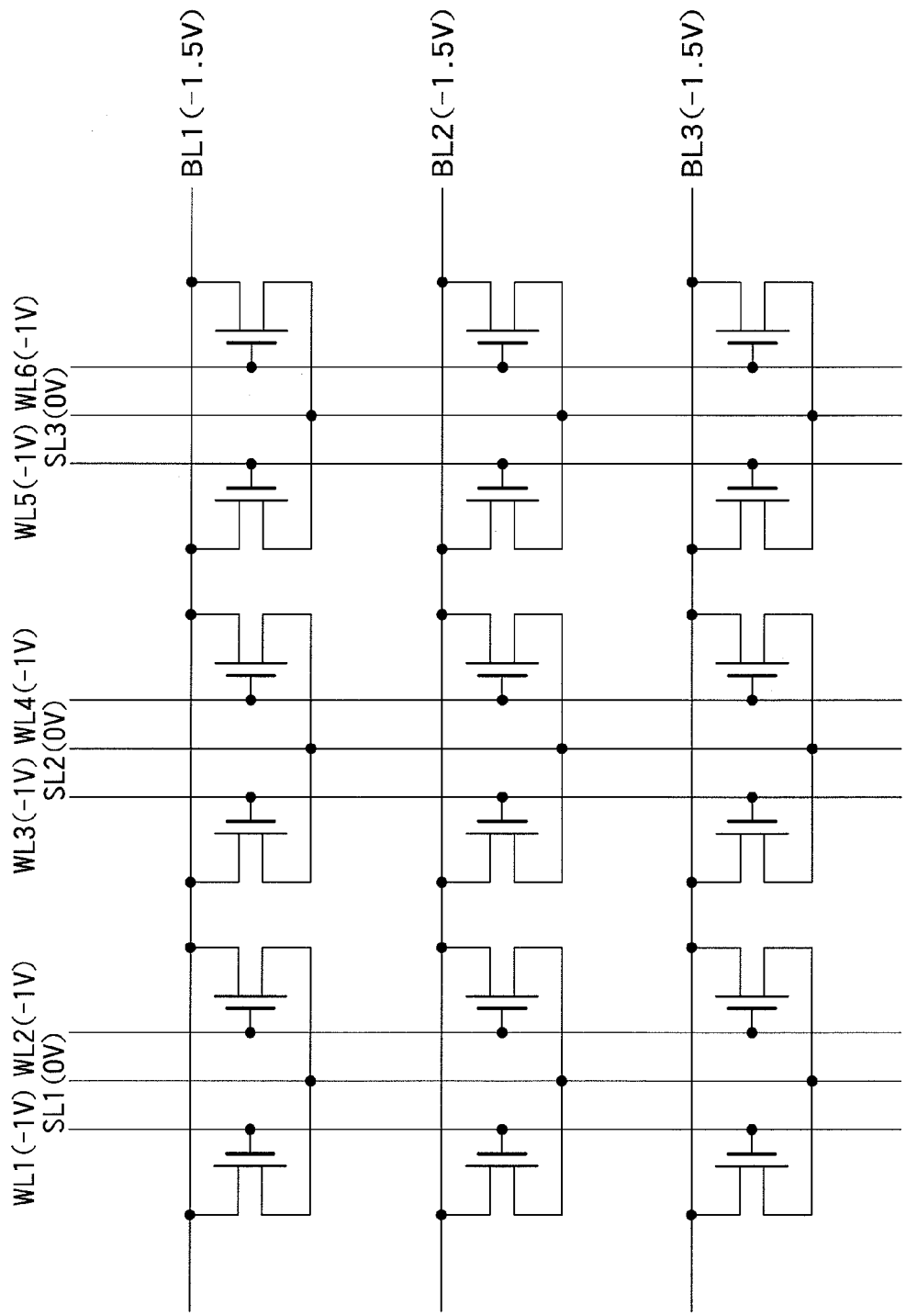
FIG. 13 is a circuit diagram showing a third write step.

Next, as shown in FIG. 13, the WL driver WLD applies a negative voltage (for example, −1 V) to all word lines WL1 to WL6 and the CSL driver CSLD applies a negative voltage (for example, −1.5 V) in a potential direction which is the same as that of voltage of the word lines WL1 to WL6 to all bit lines BL1 to BL3. The SL driver SLD sets all the source lines SL1 to SL3 to the reference voltage (for example, 0 V). A forward direction bias is thus applied to a junction of the P-type body region 6 and the N-type drain layer 4 of each of the memory cells MC. Holes within the body region 6 thus disappear, so that all the memory cells MC become "0" cells. Absolute values of voltages of the word lines WL1 to WL6, the bit lines BL1 to BL3, and the source lines SL1 to SL3 are set to be small. Accordingly, the polarization state of the gate dielectric film 7 is not changed.

(Fourth Write Step)

Figure 14:
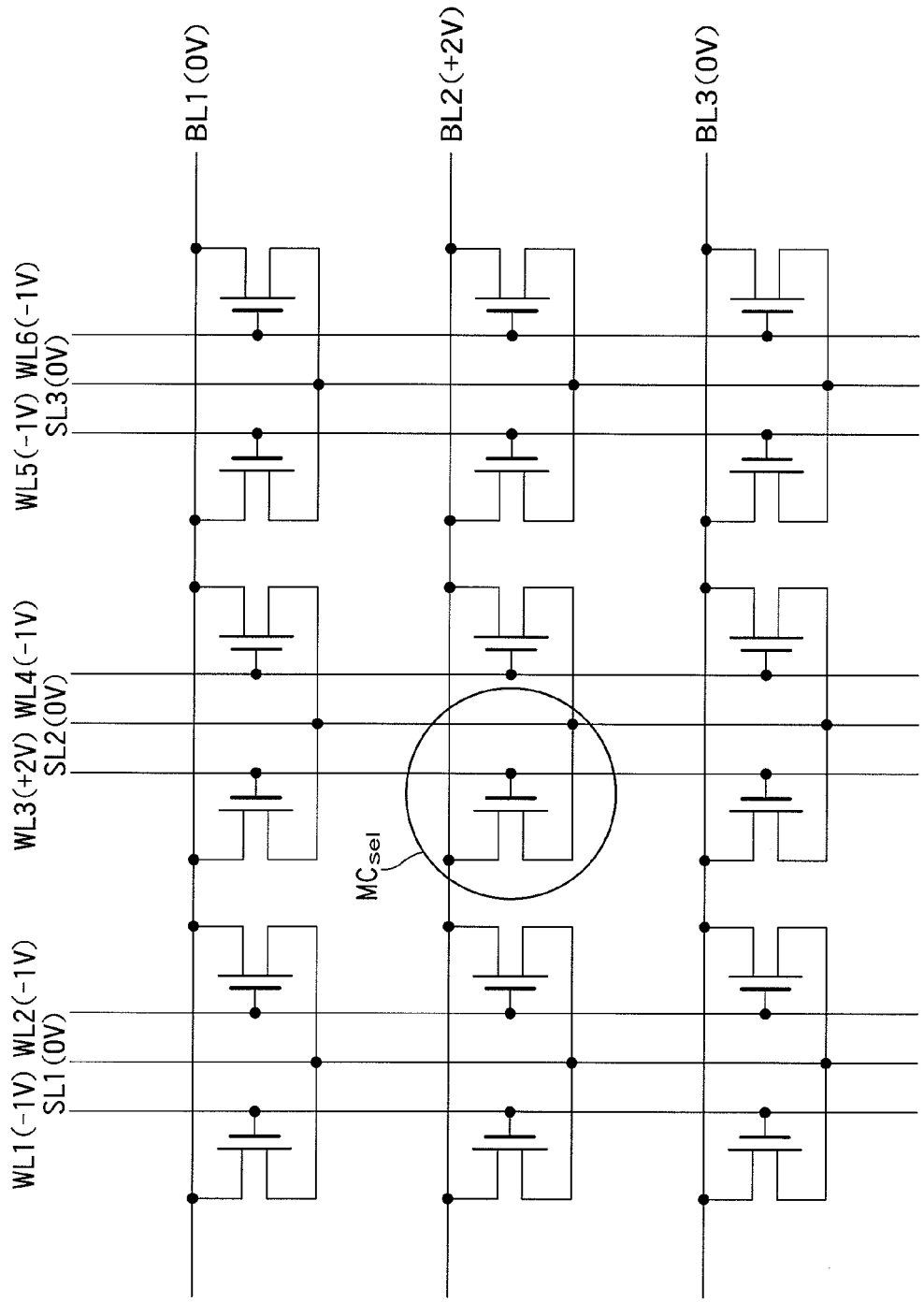
FIG. 14 is a circuit diagram showing a fourth write step.

Next, holes serving as majority carriers are then accumulated in the body region 6 of a selected memory cell MCsel shown by the solid line circle in FIG. 14. For example, the WL driver WLD applies a negative voltage (for example, −1 V) which is the same as that of the word line in the third write step to unselected word lines WL1, WL2, and WL4 to WL6. The WL driver WLD applies a positive voltage (for example, +2 V) whose polarity is opposite to that of the unselected word lines WL1, WL2, and WL4 to WL6 to the selected word line WL3. The CSL driver CSLD applies the reference voltage to unselected bit lines BL1 and BL3 and a positive voltage (for example, +2 V) whose polarity is the same as that of the selected word line WL3 to a selected bit line BL2. A large electric field is thus applied to a boundary between the drain layer 4 and the body region 6 of the selected memory cell MCsel. As a result, impact ionization occurs at the boundary between the drain layer 4 and the body region 6 of the selected memory cell MCsel and holes are accumulated in the body region 6. The selected memory cell MCsel thus becomes a "1" cell. Such a large electric field is not applied to boundaries between the drain layer 4 and the body region 6 in unselected memory cells other than MCsel. The selected memory cell MCsel thus becomes a "1" cell and the unselected memory cells remain as "0" cells.

By performing the first to fourth write steps as described above, logical data can be written in the gate dielectric film 7 and in the body region 6 of each of the memory cells MC. That is, each of the memory cells MC can store 2-bit data (four-value data).

As described above, logical data is written in the gate dielectric film 7 and then in the body region 6 of the first embodiment. That is, the third and fourth write steps are performed after the first and second write steps. When the third and fourth write steps are performed prior to the first and second write steps, at the time of writing data in the gate dielectric film 7 in the first or second write step, a large negative voltage is applied to the word lines WL1 to WL6 and the reference voltage or a positive voltage is applied to the bit line BL1 to BL3. A large electric field is thus generated between the drain layer 4 and the body region 6 so that holes are accumulated in the body region 6. GIDL (Gate Induced Drain Leakage) changing "0" cells to "1" cells may occur. To suppress such GIDL, it is preferable to write logical data in the body region 6 after it is written in the gate dielectric film 7.

Each of the memory cells MC storing four values has four different threshold voltages. By identifying these four threshold voltages, data of the ferroelectric FBC memory according to the first embodiment can be read.

(Read Step)

Figure 15:
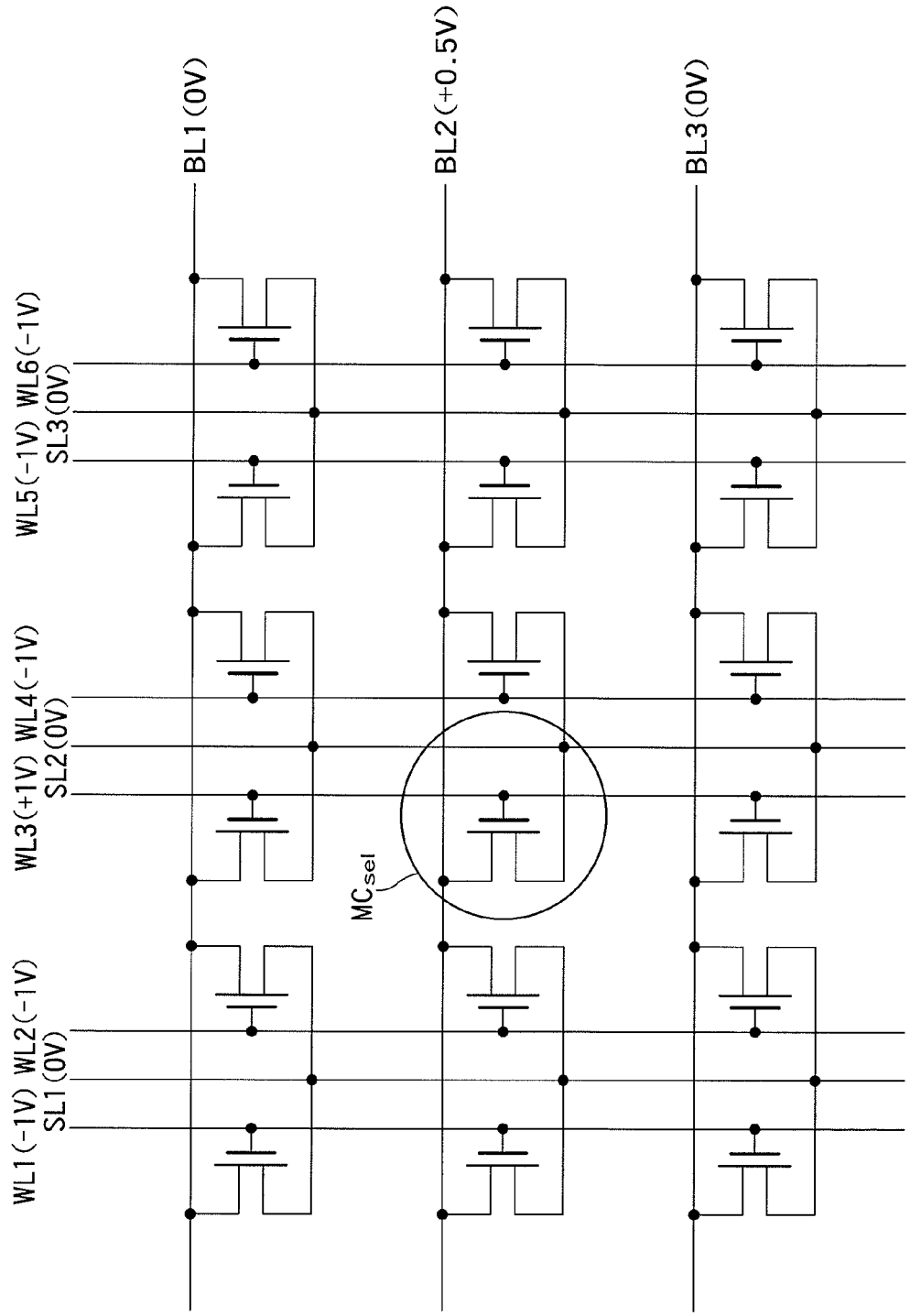
FIG. 15 is an equivalent circuit diagram showing a read operation of the ferroelectric FBC memory according to the first embodiment.

FIG. 15 is an equivalent circuit diagram showing a read operation of the ferroelectric FBC memory according to the first embodiment. According to the read operation, multiple potential levels are prepared for a selected word line. To detect 2-bit data, three potential levels of the selected word line are required. The sense amplifier S/A detects logic of data for each potential level of the selected word line. For example, the threshold voltage of a selected memory cell is different for cases where data stored in the gate dielectric film 7 and the body region 6 is (0, 1), (0, 0), (1, 1), and (1, 0). A first potential level of the selected word line during read is set to a potential between the threshold voltage for (0, 1) and the threshold voltage for (0, 0). A second potential level is set to a potential between the threshold voltage for (0, 0) and the threshold voltage for (1, 1). A third potential level is set to a potential between the threshold voltage for (1, 1) and the threshold voltage for (1, 0). The sense amplifier S/A first detects data of the selected memory cell by setting the potential of the selected word line to the second potential level. As a result of detection, for example, when it is found that the gate dielectric film 7 has data "0", the WL driver WLD sets the potential of the selected word line WL to the first potential level and the sense amplifier S/A detects again the data of the selected memory cell. In this way, 2-bit data stored in the gate dielectric film 7 and in the body region 6 of the selected memory cell can be detected. Meanwhile, when it is found that, for example, the gate dielectric film 7 has data "1" in the first data detection by the sense amplifier S/A, the WL driver WLD sets the potential of the selected word line WL to the third potential level and the sense amplifier S/A detects again the data of the selected memory cell. The 2-bit data stored in the gate dielectric film 7 and in the body region 6 of the selected memory cell can thus be detected. The data detected by the sense amplifier S/A in the first data detection is temporarily held in the ferroelectric FBC memory or an external SRAM.

An operation when a selected word line is set to a certain potential level is described next with reference to FIG. 15.

For example, a negative voltage (for example, −1 V) whose polarity is opposite that of to holes is applied to unselected word lines WL1, WL2, and WL4 to WL6 to hold holes accumulated in the body region 6. However, when the negative voltage of the unselected word lines WL1, WL2, and WL4 to WL6 is large as an absolute value, the positive polarization of the gate dielectric film 7 may be inverted. Accordingly, the negative voltage of the unselected word lines WL1, WL2, and WL4 to WL6 is smaller as an absolute value than that of the word lines WL1 to WL6 applied in the first write step.

Meanwhile, a positive voltage (for example, +1 V) whose polarity is opposite to that of voltage of the unselected word lines WL1, WL2, and WL4 to WL6 is applied to a selected word line WL3. However, when the positive voltage of the selected word line WL3 is larger as an absolute value, the negative polarization of the gate dielectric film 7 may be inverted. Therefore, the positive voltage of the selected word line WL3 is smaller as an absolute value than the positive voltage (for example, +4 V) applied to the selected word line WL3 in the second write step. Further, when the positive voltage of the selected word line WL3 is large as an absolute value, impact ionization may occur at the boundary between the drain layer 4 and the body region 6, so that "0" cells may be changed to "1" cells. The positive voltage of the selected word line WL3 is smaller as an absolute value than the positive voltage (for example, +2 V) applied to the selected word line WL3 in the fourth write step.

As described above, the voltages of the word lines WL1 to WL6 during read are smaller as absolute values than the voltages of the word lines WL1 to WL6 during write in the gate dielectric film 7 (first and second write steps) and the voltage of the selected word line WL3 during write in the body region 6 (fourth write step). A negative voltage (for example, −1 V) which is the same as that of the unselected word lines WL1, WL2, and WL4 to WL6 in the third and fourth write steps is applied to the unselected word lines WL1, WL2, and WL4 to WL6.

While unselected bit lines BL1 and BL3 are maintained at the reference voltage, a positive voltage (for example, +0.5 V) whose polarity is the same as that of voltage of the selected word line WL3 is applied to a selected bit line BL2. Because the voltage of the selected bit line BL2 has the same polarity as the voltage of the selected word line WL3, the voltage applied to the gate dielectric film 7 of the selected memory cell MCsel is smaller than the one applied to the gate dielectric film 7 in the first write step. Accordingly, the data of the selected memory cell MCsel can be read without changing the polarization state of the gate dielectric film 7 in each of the memory cells MC.

Further, the voltage of the selected word line WL3 during read is a positive voltage smaller as an absolute value than the voltage of the selected word line WL3 in the fourth write step and the voltage of the selected bit line BL2 is a positive voltage smaller as an absolute value than the voltage of the selected bit line BL2 in the fourth write step. The selected memory cell MCsel is thus operated in a linear region. As a result, data can be read from the selected memory cell MCsel without disturbing the data stored in the body region 6 of a memory cell connected to the selected word line WL3.

The unselected bit lines BL1 and BL3 and the source lines SL1 to SL3 are maintained at the reference voltage. Accordingly, unselected memory cells MC connected to the unselected word lines WL1, WL2, and WL4 to WL6 and the unselected bit lines BL1 and BL3 hold data stored in their gate dielectric films 7 and body regions 6.

The voltage of the selected bit line BL2 (for example, +0.5 V) is smaller as an absolute value than that of the unselected word lines WL1, WL2, and WL4 to WL6 (for example, −1 V). Accordingly, unselected memory cells connected to the selected bit line BL2 and the unselected word lines WL1, WL2, and WL4 to WL6 can hold data in their body regions 6. Furthermore, the difference in voltage between the selected bit line BL2 and the unselected word lines WL1, WL2, and WL4 to WL6 (for example, 1.5 V) is sufficiently smaller than the one between the word lines WL1 to WL6 and the bit lines BL1 to BL3 in the first write step (for example, 3 V). Therefore, data in the gate dielectric films 7 of the unselected memory cells connected to the selected bit line BL2 and the unselected word lines WL1, WL2, and WL4 to WL6 are not broken in the read step.

As described above, the ferroelectric FBC memory according to the first embodiment can store 1-bit data in the gate dielectric film 7 and in the body region 6, respectively. While the step of forming a gate dielectric film and the step of etching the gate dielectric film are different from conventional ones to make the gate dielectric film of the FBC memory into a ferroelectric film, other manufacturing steps can be the same as conventional manufacturing steps. Accordingly, in the ferroelectric FBC memory according to the first embodiment, the memory capacity can be increased without complicating manufacturing processes as compared to those of conventional techniques.

(First Modification of First Embodiment)

Figure 16:
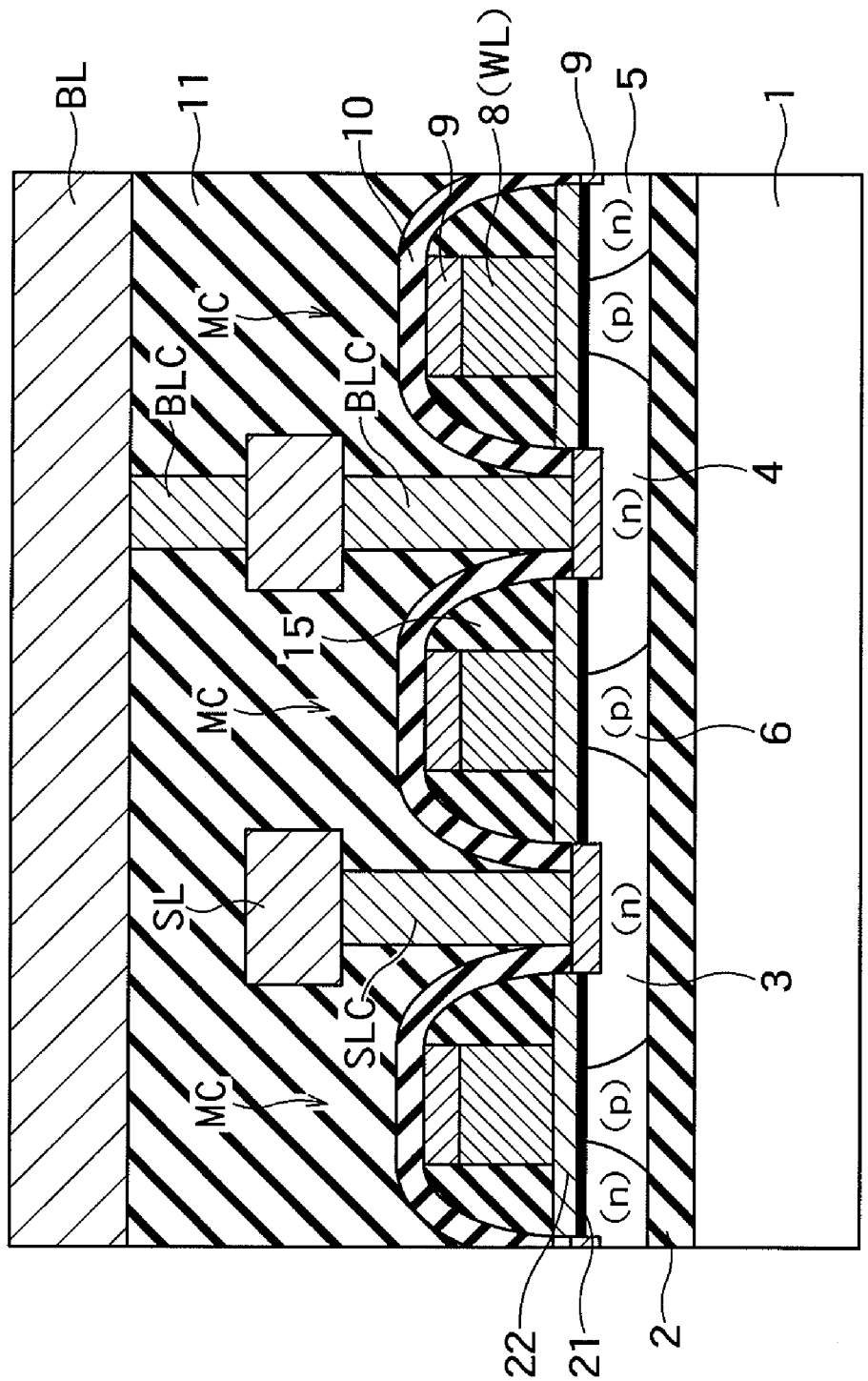
FIG. 16 is a cross-sectional view of a ferroelectric FBC memory according to a first modification of the first embodiment.

FIG. 16 is a cross-sectional view of a ferroelectric FBC memory according to a first modification of the first embodiment. In the first embodiment described above, the gate dielectric film 7 serving as a ferroelectric film is located on the body region 6. However, when a ferroelectric film is located directly on a silicon substrate, a ferroelectric material may diffuse into a channel for the body region 6. To prevent such diffusion of the ferroelectric material, a first insulating film 21 made of a paraelectric film (silicon oxide film, $HfO_2$, $Y_2O_3$, HfSiON, HfSiO, $Ta_2O_5$, $BaTiO_3$, $BaZrO_3$, $ZrO_2$, or $Al_2O_3$) can be formed on the SOI layer 5 and a second insulating film 22 made of a ferroelectric film with polarization characteristics can be formed on the first insulating film 21 in the first modification, as shown in FIG. 16. Accordingly, the first insulating film 21 functions as a buffer in process to prevent the ferroelectric material from diffusing into the body region 6 in a thermal treatment step. Further, formation of the first insulating film 21 on the SOI layer 5 can also suppress a decrease in carrier mobility.

(Second Modification of First Embodiment)

Figure 17:
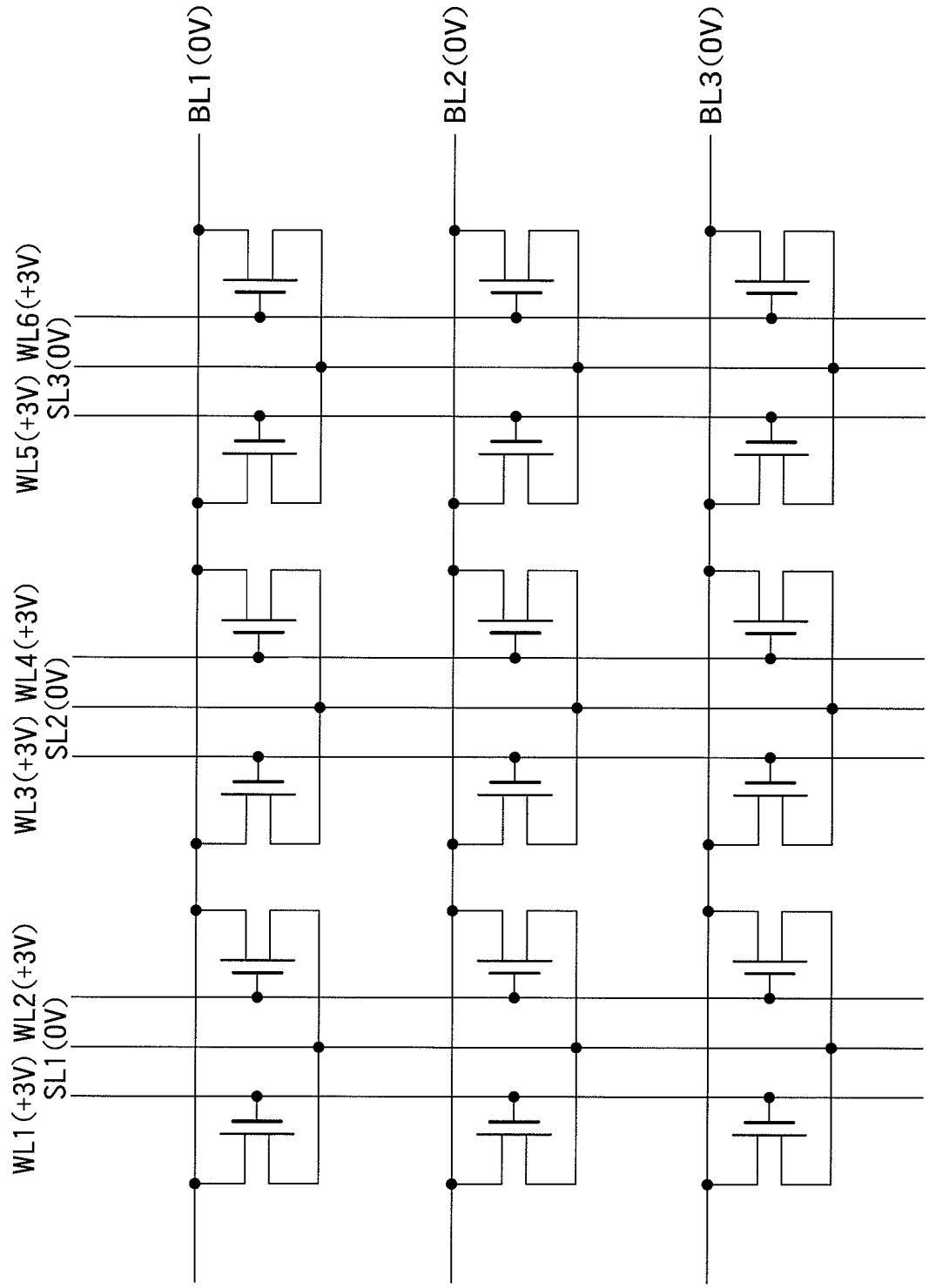
FIGS. 17 and 18 are equivalent circuit diagrams showing an operation of a ferroelectric FBC memory according to a second modification of the first embodiment.
Figure 18:
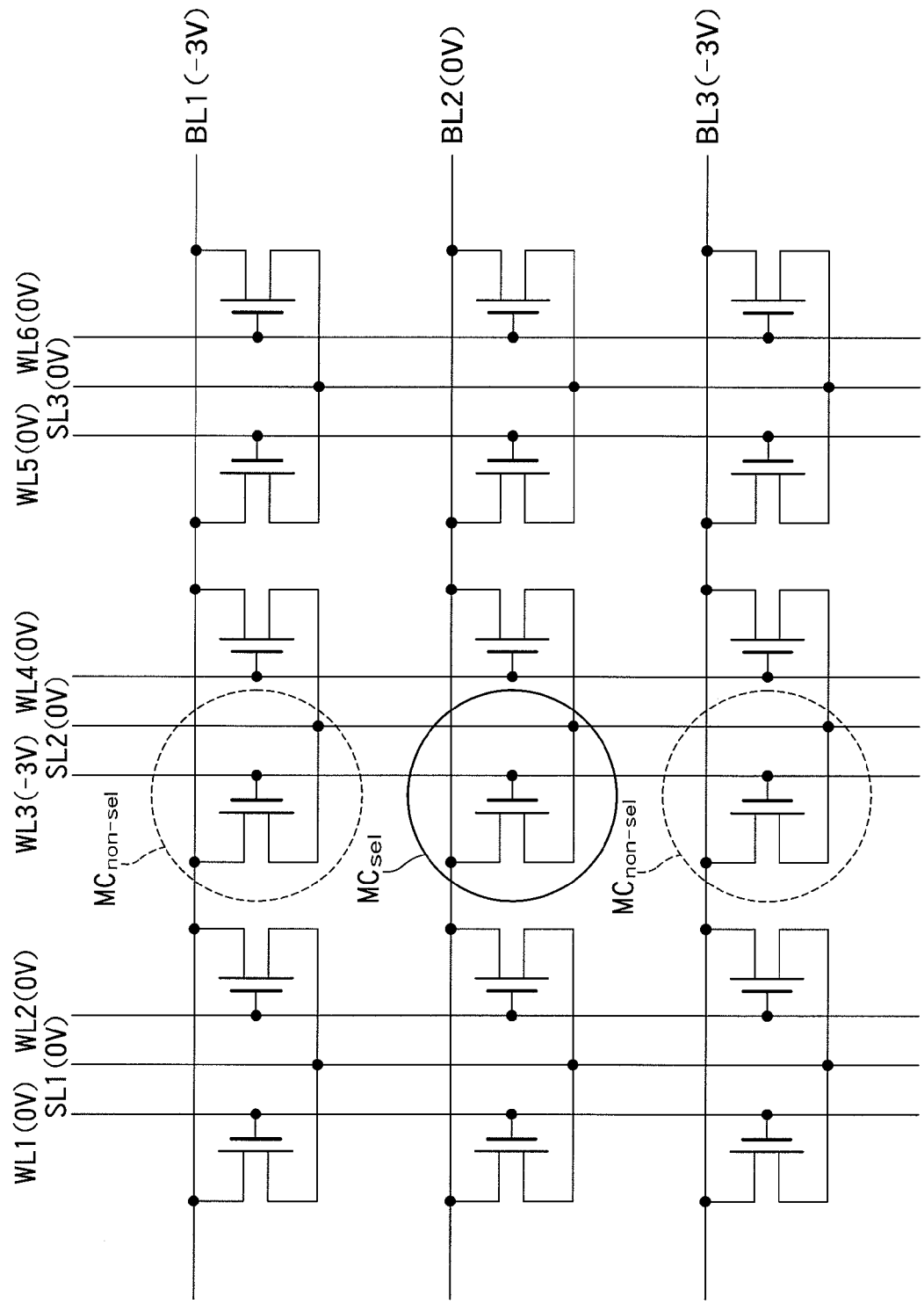

FIGS. 17 and 18 are equivalent circuit diagrams showing an operation of a ferroelectric FBC memory according to a second modification of the first embodiment. According to the first embodiment described above, the gate dielectric films 7 of all the memory cells MC are set to be in a negative polarization state in the first write step and then the gate dielectric film 7 of a selected memory cell MCsel is set to be in a positive polarization state in the second write step.

On the other hand, according to the second modification, the gate dielectric films 7 of all the memory cells MC are set to be in the positive polarization state in the first write step and then the gate dielectric film 7 of a selected memory cell MCsel is set to be in the negative polarization state in the second write step.

(First Write Step)

As shown in FIG. 17, the WL driver WLD applies a positive voltage (for example, +3 V) to all word lines WL1 to WL6 while setting all the source lines SL1 to SL3 and all bit lines BL1 to BL3 to a reference voltage (for example, 0 V). At this time, it is assumed that the positive voltage applied to the word lines WL1 to WL6 is sufficient to polarize a ferroelectric film serving as the gate dielectric film 7. The voltage of the word lines WL1 to WL6 is lower than the potential of the bit lines BL1 to BL3 and the source lines SL1 to SL3 by 3 V. The voltage of the word lines WL1 to WL6 is thus higher than the potential of the body region 6 and the gate dielectric films 7 of all the memory cells MC become a positive polarization state.

(Second Write Step)

As shown in FIG. 18, the polarization states of the gate dielectric films 7 of the memory cells MC are selectively inverted. That is, the polarization state of the gate dielectric film 7 of a selected memory cell MC is inverted from positive polarization to negative polarization. For example, the WL driver WLD applies a negative voltage (for example, −3 V) to a selected word line WL3 and sets unselected word lines WL1, WL2, and WL4 to WL6 to the reference voltage. The SL driver SLD sets the voltage of the source lines SL1 to SL3 to the reference voltage. Further, the CSL driver CSLD sets the voltage of unselected bit lines BL1 and BL3 to a negative potential (for example, −3 V) in a direction which is the same as that of the selected word line WL3 while maintaining the voltage of a selected bit line BL2 at the reference voltage.

The gate voltages of a selected memory cell MCsel shown by a solid line circle shown in FIG. 18 and an unselected memory cell MCnon-sel shown by a broken line circle in FIG. 18 are reduced by the negative voltage of the selected word line WL3. Besides, because the selected bit line BL2 to which the selected memory cell MCsel is connected has the reference voltage (for example, 0 V), the potential of the body region 6 of the selected memory cell MCsel is higher than the gate voltage of the selected memory cell MCsel. In this way, an electric field in a direction opposite to that of the electric field applied to the gate dielectric film 7 in the first write step is applied to the gate dielectric film 7 of the selected memory cell MCsel. As a result, the gate dielectric film 7 of the selected memory cell MCsel becomes a negative polarization state.

A negative voltage (for example, −3 V) which is the same as that of the selected word line WL3 is applied to the bit lines BL1 and BL3 corresponding to the respective unselected memory cells MCnon-sel connected to the selected word line WL3. Accordingly, the potential of the body region 6 of the unselected memory cell MCnon-sel shifts in the potential direction of the selected word line WL3. Therefore, an electric field for inverting polarization is not applied to the gate dielectric film 7 of the unselected memory cell MCnon-sel. As a result, the gate dielectric film 7 of the unselected memory cell MCnon-sel connected to the selected word line WL3 maintains the positive polarization.

The reference voltage (0 V) is applied to the unselected word lines WL1, WL2, and WL4 to WL6, and the bit lines BL1 to BL3 and the source lines SL1 to SL3 have a negative voltage (−3 V) or the reference voltage which is the same as that of the unselected word lines WL1, WL2, and WL4 to WL6. Accordingly, an electric field in a direction which is the same as that of the one applied to the gate dielectric film 7 in the first write step is applied to the respective gate dielectric films 7 of unselected memory cells connected to the unselected word lines WL1, WL2, and WL4 to WL6 or an electric filed is hardly applied thereto. As a result, the respective gate dielectric films 7 of the unselected memory cells connected to the unselected word lines WL1, WL2, and WL4 to WL6 maintain the positive polarization. Subsequent third and fourth write steps and read step are the same as those of the first embodiment.

As described above, even when the gate dielectric films 7 of all the memory cells MC are first set to be in the positive polarization state and then the gate dielectric film 7 of a selected memory cell MC is set to be in the negative polarization state, the ferroelectric FBC memory can achieve the effects of the first embodiment.

Note that the first modification can be combined with the second modification. When these modifications are combined, the second modification can also achieve the effects of the first modification.

(Second Embodiment)

Figure 19:
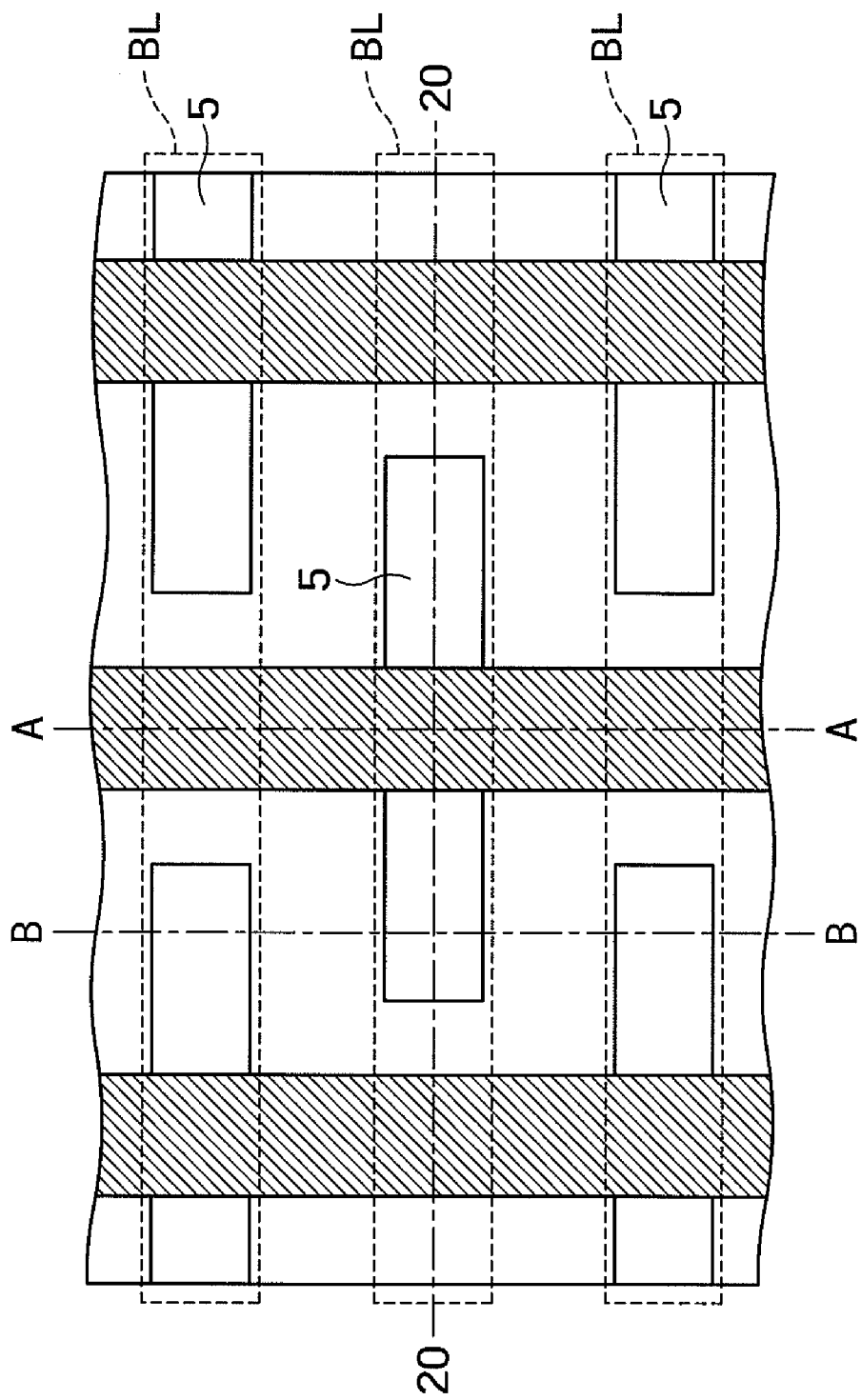
FIG. 19 is a plan view of a cell array area of a ferroelectric FBC memory according to a second embodiment of the present invention.
Figure 20:
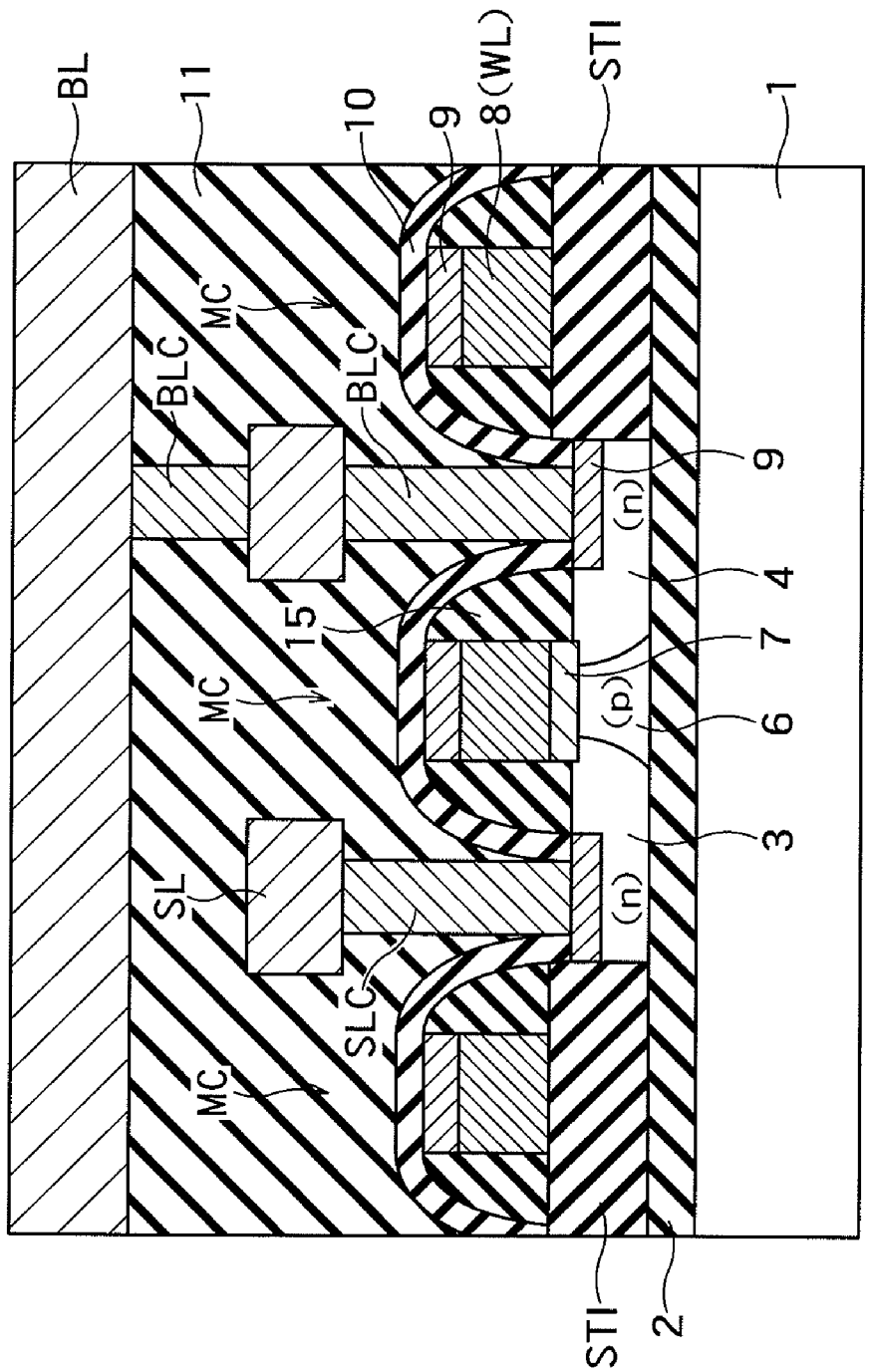
FIG. 20 is a cross-sectional view along a line 20-20 in FIG. 19.
Figure 21A:
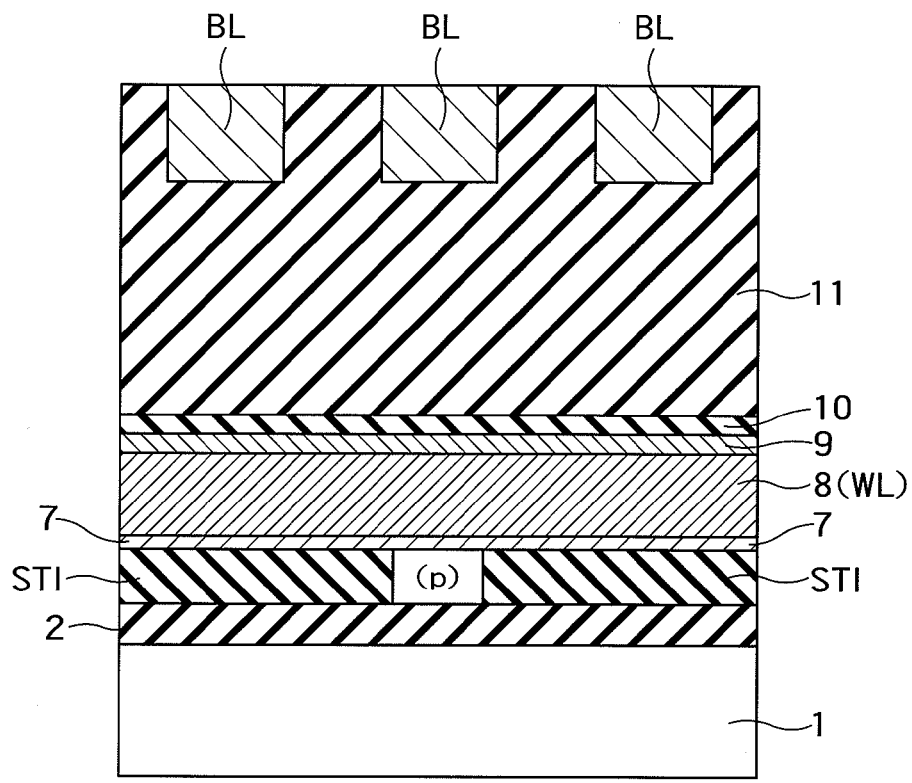
FIG. 21A is a cross-sectional view along a line A-A in FIG. 19.
Figure 21B:
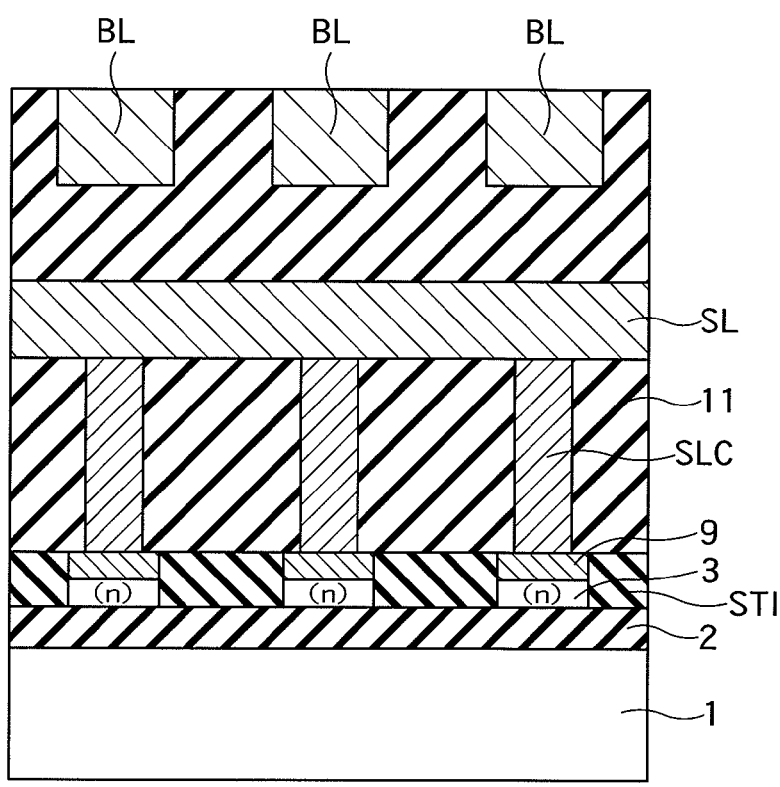
FIG. 21B is a cross-sectional view along a line B-B in FIG. 19.

FIG. 19 is a plan view of a cell array area of a ferroelectric FBC memory according to a second embodiment of the present invention. FIG. 20 is a cross-sectional view along a line 20-20 in FIG. 19. FIG. 21A is a cross-sectional view along a line A-A in FIG. 19. FIG. 21B is a cross-sectional view along a line B-B in FIG. 19. Configurations of the word lines WL according to the first and second embodiments are the same. However, an SOI layer 5 of the second embodiment is formed like an island. The bit line BL is formed above the island-like SOI layer 5 so as to overlap it.

As shown in FIG. 20, the body regions 6 of the memory cells MC are not adjacent to each other continuously in the column direction. Furthermore, as shown in FIGS. 20 and 21A, periphery the body region 6 of each of the memory cells MC is surrounded by an STI. Each of the body regions 6 is thus formed like an island. That is, each of the memory cells MC is constituted by a complete isolation transistor. The cross-sectional view shown in FIG. 21B is the same as that of FIG. 4B.

Other configurations of the second embodiment can be the same as those of the first embodiment. A manufacturing method according to the second embodiment is different from that of the first embodiment in a photomask used in the step of processing the SOI layer 5. However, other steps of the manufacturing method according to the second embodiment can be the same as those of the manufacturing method according to the first embodiment.

A write operation and a read operation in the second embodiment can be the same as those of the first embodiment. Thus, the memory cells MC according to the second embodiment can function as multi-value memories and the same effects as those of the first embodiment can be achieved.

Further, at least one or both of the first and second modifications of the first embodiment can be combined with the second embodiment. When these are combined, the second embodiment can also achieve the effects of one or both of the first and second modifications.

While the memory cell MC is constituted by an N-FET in the above embodiments, it can be constituted by a P-FET. In the case of using a P-FET, the polarity of a voltage applied to each electrode during the write operation and the read operation becomes opposite; however, it is needless to mention that the same effects as those of the above embodiments can be achieved.

The invention claimed is:

1. A semiconductor memory device comprising a plurality of memory cells on a semiconductor layer,
    each of the memory cells comprising:
        a source layer and a drain layer in the semiconductor layer;
        an electrically floating body region provided in the semiconductor layer between the source layer and the drain layer and configured to accumulate or discharge electric charges in order to store logical data;
        a gate dielectric film provided on the body region and comprising a ferroelectric film with polarization characteristics; and
        a gate electrode provided on the gate dielectric film above the body region, wherein
        each memory cell stores a plurality of logical data depending on an amount of electric charges accumulated in the body region and on a polarization state of the ferroelectric film.

2. The device of claim 1, wherein the gate dielectric film is a laminated film comprising a first insulating film provided on the semiconductor layer and made of a paraelectric film and a second insulating film provided on the first insulating film and made of a ferroelectric film with polarization characteristics.

3. The device of claim 1, wherein in a write operation of logical data, logical data is written in the ferroelectric film of the memory cell and then written in the body region of the memory cell.

4. The device of claim 2, wherein in a write operation of logical data, logical data is written in the ferroelectric film of the memory cell and then written in the body region of the memory cell.

5. The device of claim 1, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and
    at a time of writing logical data in the body region, the first logical data is written in all body regions of the memory cells, and then the second logical data is written in a body region of a memory cell selected from the memory cells.

6. The device of claim 2, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and
    at a time of writing logical data in the body region, the first logical data is written in all body regions of the memory cells, and then the second logical data is written in a body region of a memory cell selected from the memory cells.

7. The device of claim 3, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and
    at a time of writing logical data in the body region, the first logical data is written in all body regions of the memory cells, and then the second logical data is written in a body region of a memory cell selected from the memory cells.

8. The device of claim 1, wherein periphery of a body region of each of the memory cells is surrounded by an element isolation region.

9. The device of claim 2, wherein the first insulating film is made of a silicon oxide film, $HfO_2$, $Y_2O_3$, HfSiON, HfSiO, $Ta_2O_5$, $BaTiO_3$, $BaZrO_3$, $ZrO_2$, or $Al_2O_3$.

10. The device of claim 1, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and at a time of writing logical data in the body region, the second logical data is written in all body regions of the memory cells, and then the first logical data is written in a body region of a memory cell selected from the memory cells.

11. The device of claim 2, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and at a time of writing logical data in the body region, the second logical data is written in all body regions of the memory cells, and then the first logical data is written in a body region of a memory cell selected from the memory cells.

12. The device of claim 3, wherein at a time of writing logical data in the ferroelectric film, first logical data is written in all ferroelectric films of the memory cells, and second logical data whose logic is opposite to that of the first logical data is then written in a ferroelectric film of a memory cell selected from the memory cells, and at a time of writing logical data in the body region, the second logical data is written in all body regions of the memory cells, and then the first logical data is written in a body region of a memory cell selected from the memory cells.

* * * * *